(12) United States Patent
Kanno et al.

(10) Patent No.: US 7,474,119 B2
(45) Date of Patent: Jan. 6, 2009

(54) LOGIC CIRCUIT APPARATUS AND TIMESHARE OPERATING METHOD OF A PROGRAMMABLE LOGIC CIRCUIT

(75) Inventors: Shinichi Kanno, Kanagawa-ken (JP); Yukimasa Miyamoto, Kanagawa-ken (JP); Masaya Tarui, Kanagawa-ken (JP); Taku Ooneda, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 446 days.

(21) Appl. No.: 10/948,702

(22) Filed: Sep. 24, 2004

(65) Prior Publication Data

US 2005/0110518 A1   May 26, 2005

(30) Foreign Application Priority Data

Sep. 24, 2003  (JP) ............................. 2003-332108
May 19, 2004  (JP) ............................. 2004-148464

(51) Int. Cl.
  *G06F 7/38* (2006.01)
  *H03F 19/173* (2006.01)
(52) U.S. Cl. ............................. 326/38; 326/37; 326/46
(58) Field of Classification Search ............... 326/38
  See application file for complete search history.

(56) References Cited

U.S. PATENT DOCUMENTS

| 6,034,538 | A | 3/2000 | Abramovici |
| 6,621,295 | B1 * | 9/2003 | James-Roxby et al. ........ 326/38 |
| 6,842,854 | B2 * | 1/2005 | Nishihara et al. ........... 712/228 |

| 2004/0139441 | A1 | 7/2004 | Kaburaki et al. |
| 2005/0110518 | A1 | 5/2005 | Kanno et al. |

FOREIGN PATENT DOCUMENTS

| JP | 2001-202236 | 7/2001 |
| JP | 2003-003428 | 1/2003 |
| JP | 2003-079478 | 3/2003 |

OTHER PUBLICATIONS

U.S. Appl. No. 11/128,187, filed May 13, 2005, Ohneda, et al.
U.S. Appl. No. 10/948,702, filed Sep. 24, 2004, Kanno et al.
U.S. Appl. No. 11/081,589, filed Mar. 17, 2005, Kanno et al.
U.S. Appl. No. 10/960,707, filed Oct. 8, 2004, Ooneda et al.
U.S. Appl. No. 11/387,872, filed Mar. 24, 2006, Kanno et al.

* cited by examiner

*Primary Examiner*—Rexford Barnie
*Assistant Examiner*—Matthew C Tabler
(74) *Attorney, Agent, or Firm*—Oblon, Spivak, McClelland, Maier & Neustadt, P.C.

(57) ABSTRACT

A logic circuit apparatus that allocates process capability to unit circuits operated in a time divisional manner, including a circuit arrangement information memory which stores circuit arrangement information corresponding to each of plurality of unit circuits, and a programmable logic circuit with a circuit arrangement which can be reconfigured by employing the circuit arrangement information while the programmable logic circuit is being operated, a process data memory which stores both input data and output data related to a process operation of each of the circuits, and a controller which monitors a storage amount of the input data and/or a storage amount of the output data corresponding to each unit circuit, and which controls reconfiguration of the circuit arrangement of the programmable logic circuit when the storage amount satisfies a certain condition.

30 Claims, 16 Drawing Sheets

LOGIC CIRCUIT APPARATUS AND TIMESHARE OPERATING METHOD OF A PROGRAMMABLE LOGIC CIRCUIT

CROSS-REFERENCE TO RELATED APPLICATONS

This application is based upon and claims the benefit of priority from the prior Japanese Patent Applications No. 2003-332108, filed on Sep. 24, 2003, and No. 2004-148464, filed on May 19, 2004; the entire contents of which are incorporated herein by reference.

BACKGROUND OF THE INVENTION

1. Field of the Invention

The present invention relates to a logic circuit apparatus which utilizes a programmable logic circuit capable of changing a function to be realized during operation of the programmable logic circuit.

2. Description of the Related Art

In an integrated circuit including a plurality of circuits which correspond to certain processing steps, the processing speed of the integrated circuit is defined based on the step requiring the most throughput. However, since some steps only require low throughput, the entire integrated circuit provides excessively high throughput.

A programmable logic circuit is proposed that can change its circuit configuration and its function during operation. The programmable logic circuit can change either an overall circuit or a partial circuit configuration.

An example of the programmable logic circuit is a field programmable gate array (FPGA) configured to change its circuit configuration quickly. A field programmable gate array will be simply referred to as a "programmable logic circuit" hereinafter.

A conventional method of time-sharing of a programmable logic circuit is disclosed in Japanese Patent Publication (KO-KAI) No. 2001-202236. In this method, in response to throughput required by each of the steps, a time distribution for processing of the respective steps is predetermined. The circuit configuration of the programmable logic circuit is changed in accordance with the time distribution.

In this method, the time distribution must be predetermined in such a manner that the processing time for the steps requiring high throughput is prolonged, whereas the processing time for the steps requiring low throughput is shortened. Therefore, the processing times cannot be properly allocated in correspondence with the dynamic changes in the throughput which is required by the respective steps.

SUMMARY OF THE INVENTION

Embodiments of the invention provide a general-purpose logic circuit apparatus which can automatically adjust the processing time distribution in response to the throughput required for the processing of each step.

According to one aspect of the present invention, there is provided a logic circuit apparatus including a circuit arrangement information memory configured to store circuit arrangement information corresponding to each unit circuit of a plurality of unit circuits; a programmable logic circuit having a circuit arrangement which is dynamically reconfigurable using the circuit arrangement information; a process data memory configured to store both input data and output data corresponding to each unit circuit; and a controller configured to monitor at least one of a storage amount of the input data and a storage amount of the output data corresponding to each unit circuit, and to control reconfiguration of the circuit arrangement of the programmable logic circuit when the storage amount satisfies a condition.

It is to be understood that both the foregoing general description of the invention and the following detailed description are exemplary, but are not restrictive, of the invention.

BRIEF DESCRIPTION OF THE SEVERAL VIEWS OF THE DRAWINGS

A better understanding of the present invention will become more apparent from the following detailed description read in conjunction with the accompanying drawings, in which.

DETAILED DESCRIPTION OF THE INVENTION

In each of the embodiments of the present invention, a programmable logic circuit capable of changing a function to be realized, while the programmable logic circuit is being operated, is employed. Such a programmable logic circuit corresponds to a circuit capable of changing the function to be realized by reconfiguring either an entire circuit or a portion of logic structures while the circuit is being operated. For example, a field programmable gate array (FPGA) and a programmable logic device (PLD) may be conceived, which are arranged in such a manner that a high speed reconfiguration of a logic structure can be carried out. It should be understood that the above-described field programmable gate array, or programmable logic device will be simply referred to as a "programmable logic circuit" hereafter.

Figure 1:
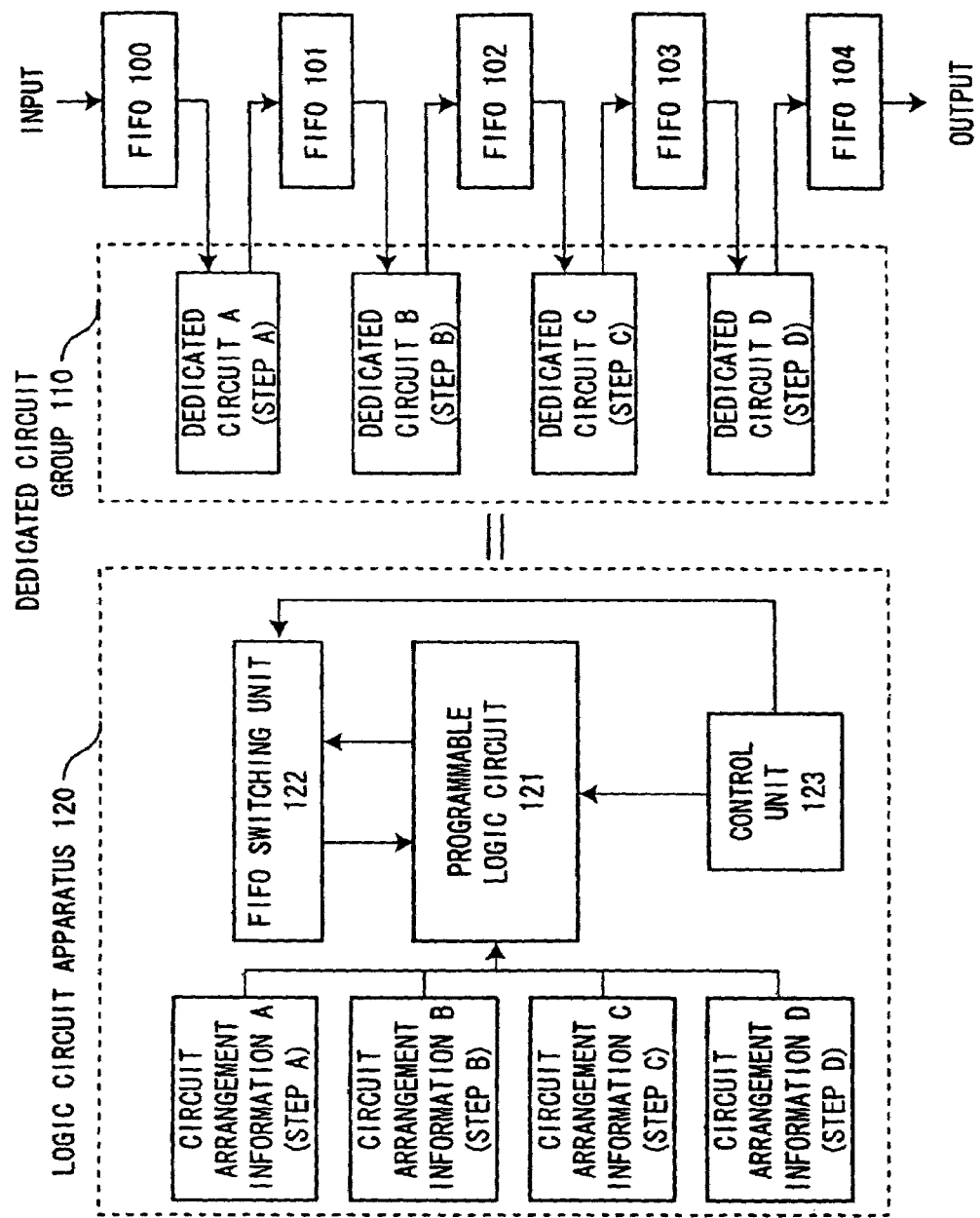
FIG. 1 is a high level block diagram of a logic circuit apparatus of respective embodiments of the present invention.

Referring now to the drawings, wherein like numerals indicate like elements throughout, FIG. 1 indicates an outline of a logic circuit apparatus including the programmable logic circuit. In FIG. 1, this logic circuit apparatus corresponds to an example, in which exemplary process operations from a step "A" to a step "D" are carried out by a single piece of programmable logic circuit 121. For simplicity sake, FIG. 1 indicates a case when the total number of the programmable logic circuits is 1. Those skilled in the art will recognize that the number of steps and circuits illustrated above are illustrative rather than exhaustive of possible examples and that further steps and circuits are embraced by the description provided herein.

Generally speaking, such a process operation may be realized by employing dedicated circuits A, B, C, D, and FIFO type memories 100, 101, 102, 103, 104. The dedicated circuits A, B, C, and D of dedicated circuit group 110 execute the respective process operations of the steps A, B, C, and D. The FIFO type memories 100, 101, 102, 103, and 104 temporarily store both inputs to the respective dedicated circuits A, B, C, D (respective steps A-D), and outputs from the respective dedicated circuits A, B, C, D. Information (INPUT) may be input to FIFO 100 and information (OUTPUT) may be output by FIFO 103. In contrast thereto, instead of the four dedicated circuits, the logic circuit apparatus of FIG. 1 is provided with the programmable logic circuit 121; 4 sorts of circuit arrangement information A, B, C, D (respective steps A-D); a FIFO switching circuit 122, and a control unit 123 for controlling operations of both the programmable logic circuit 121 and the FIFO switching unit 122.

The programmable logic circuit 121 realizes various logic circuits in accordance with externally supplied circuit arrangement information. For example, when the circuit arrangement information "A" is applied to the programmable logic circuit 121, the programmable logic circuit 121 is operated as a circuit "A." Also, when the circuit arrangement information "B" is applied to the programmable logic circuit 121, the programmable logic circuit 121 is operated as a circuit "B."

Figure 2:
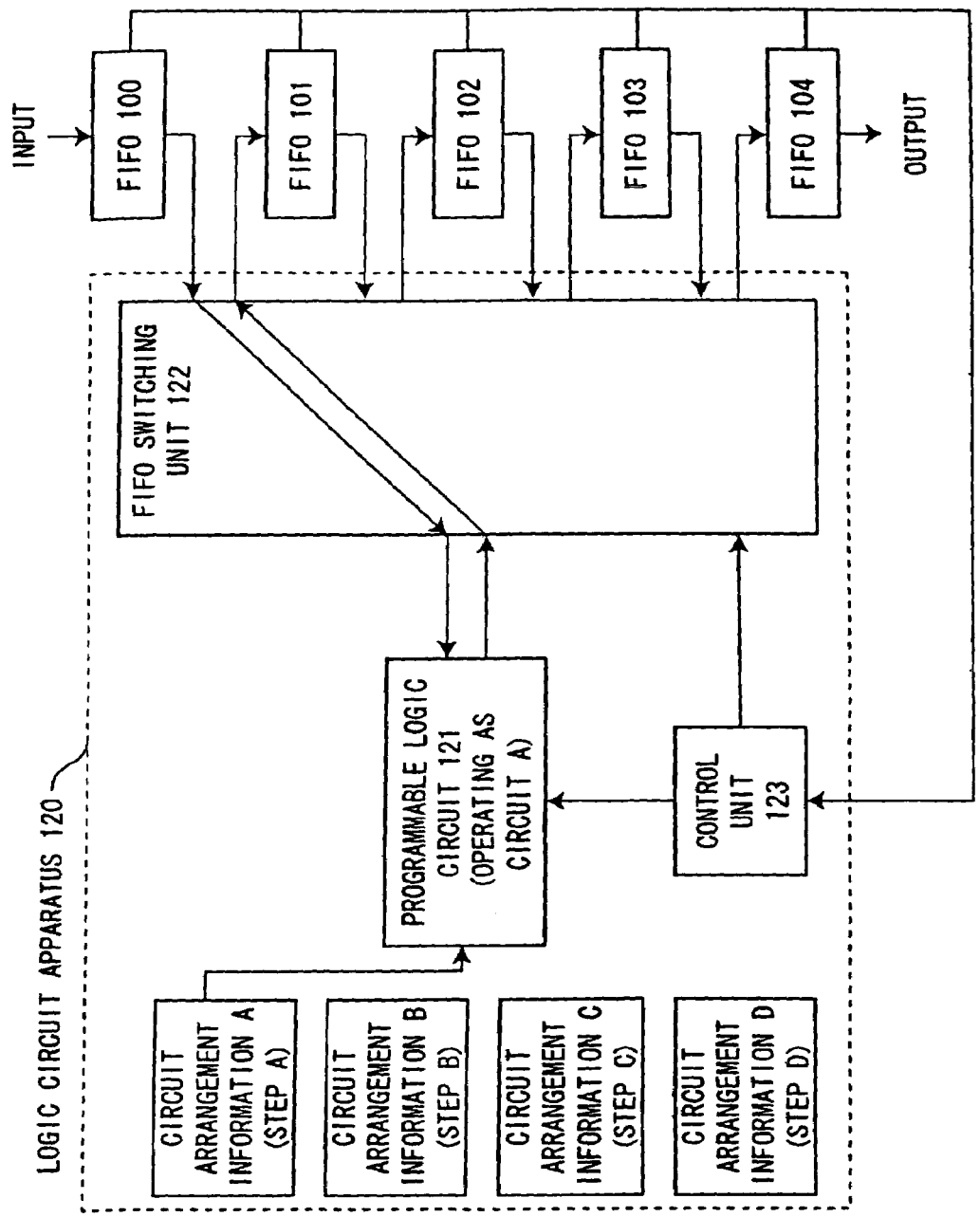
FIG. 2 is a high level block diagram illustrating an example of the operations of the logic circuit apparatus of respective embodiments of the present invention.
Figure 3:
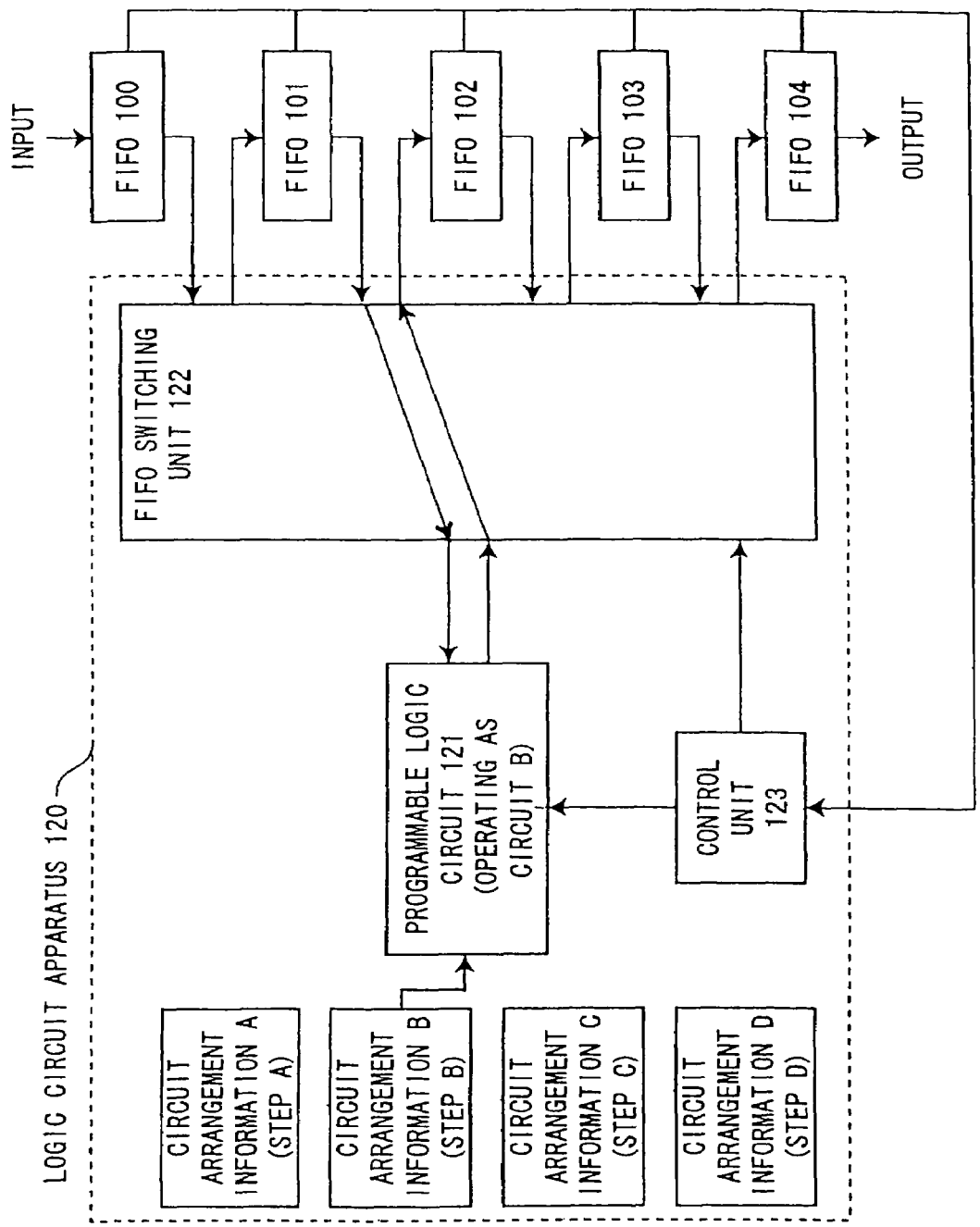
FIG. 3 is a high level block diagram illustrating another example of the operations of the logic circuit apparatus of respective embodiments of the present invention.

Also, the nature of programmable logic circuit 121 is such that its circuit arrangement is reconfigurable. In other words, the programmable logic circuit 121 can change the circuit arrangement thereof by changing circuit arrangement information which is applied thereto from an external source for example. For instance, as shown in FIG. 2, when the circuit arrangement information B is applied to the programmable logic circuit 121 which is being operated as the circuit A based on the circuit arrangement information A, this programmable logic circuit 121 is operated as the circuit B as represented in FIG. 3.

A logic circuit apparatus 120, according to this embodiment, utilizes the reconfigurable programmable logic circuit 121. Then, as represented from FIG. 2 to FIG. 5, the programmable logic circuit 121 is operated as the circuit "A" at a certain time instant; the programmable logic circuit 121 is operated as the circuit "B" at another time instant; the programmable logic circuit 121 is operated as a circuit "C" at another time instant; and the programmable logic circuit 121 is operated as a circuit "D" at another time instant. Therefore, at a certain time instant, only a process operation of the circuit A is carried out, and process operations of other circuits (B to D) are brought into stopping conditions. As previously explained, the programmable logic circuit 121 performs the process operations of the steps A, B, C and D by dynamically changing its circuit arrangement.

Figure 4:
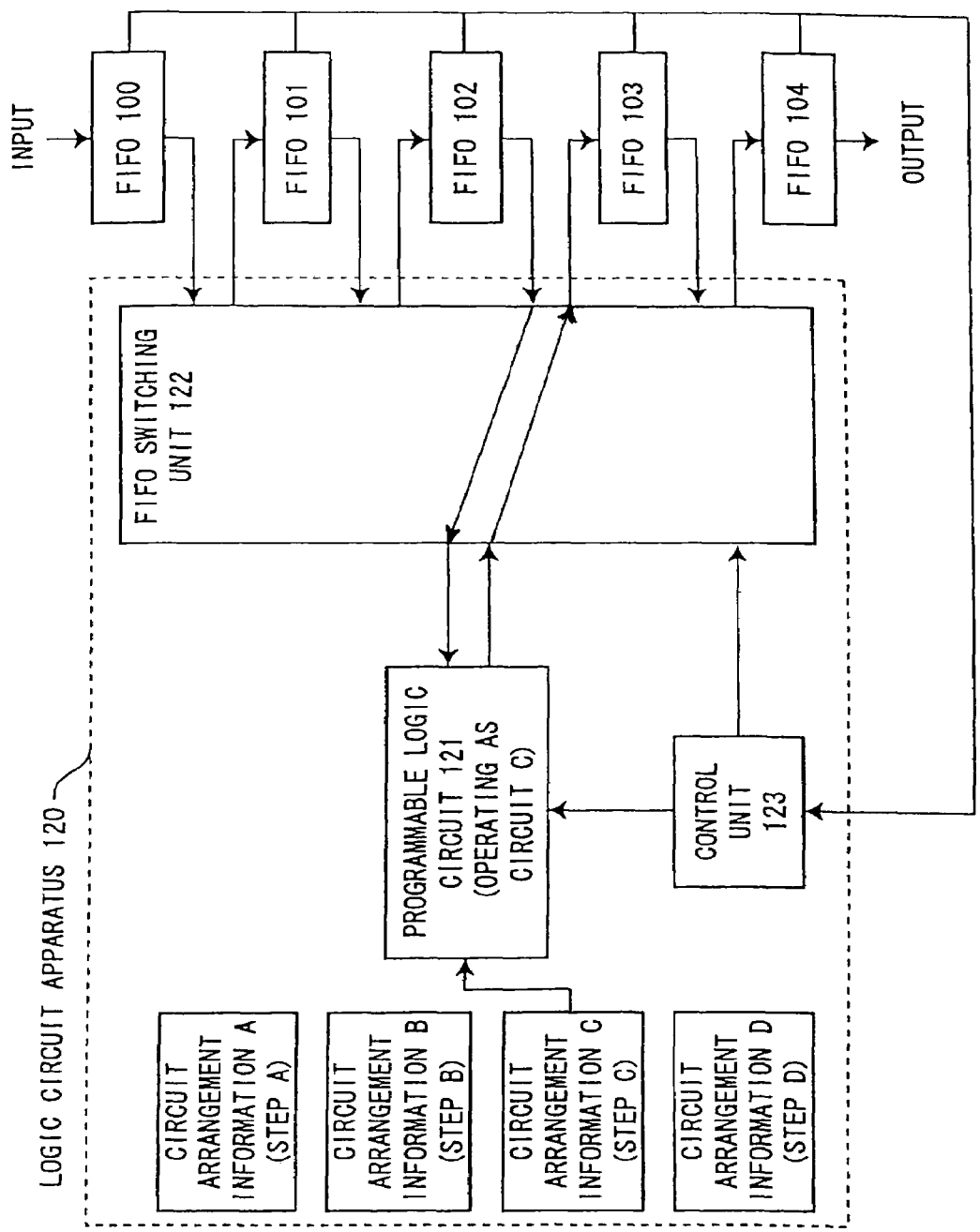
FIG. 4 is a high level block diagram illustrating another example of the to operations of the logic circuit apparatus of respective embodiments of the present invention.
Figure 5:
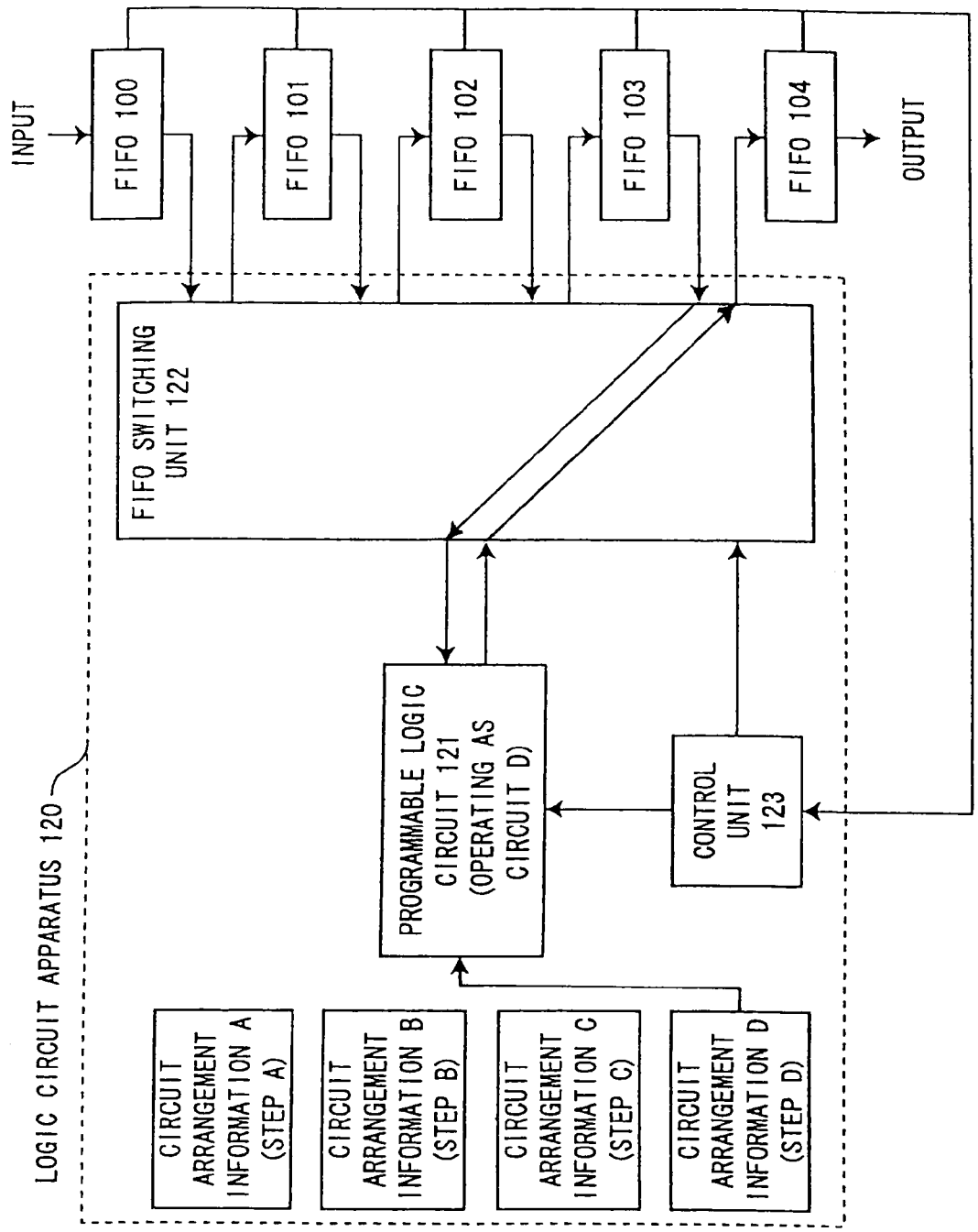
FIG. 5 is a high level block diagram illustrating another example of the operations of the logic circuit apparatus of respective embodiments of the present invention.

When a circuit arrangement of the programmable logic circuit 121 is reconfigured, the FIFO switching unit 122 changes a FIFO type memory to be connected to the programmable logic circuit 121. For example, when the programmable logic circuit 121 is operated as the circuit C, as shown in FIG. 4, the FIFO 102 is connected to the input side of the programmable logic circuit 121, and the FIFO 103 is connected to the output side of this programmable logic circuit 121. Also, when the programmable logic circuit 121 is operated as the circuit D, as shown in FIG. 5, the FIFO 103 is connected to the input side of the programmable logic circuit 121, and the FIFO 104 is connected to the output side of this programmable logic circuit 121.

The above-explained reconfiguring operation of the circuit arrangement of the programmable logic circuit 121 and the connecting FIFO switching operation of the FIFO switching unit 122 are carried out under control of the control unit 123. In the respective embodiments of the present invention, the control unit 123 determines such timing at which the programmable logic circuit 121 performs the reconfiguration operation. The control unit 123 monitors amounts of data the FIFOs 100, 101, 102, 103, and 104 store. Then, the control unit 123 determines whether or not the programmable logic circuit 121 performs the reconfiguring operation based on the data amount. In other words, the control unit 123 executes scheduling of operations of the respective unit circuits.

Figure 6:
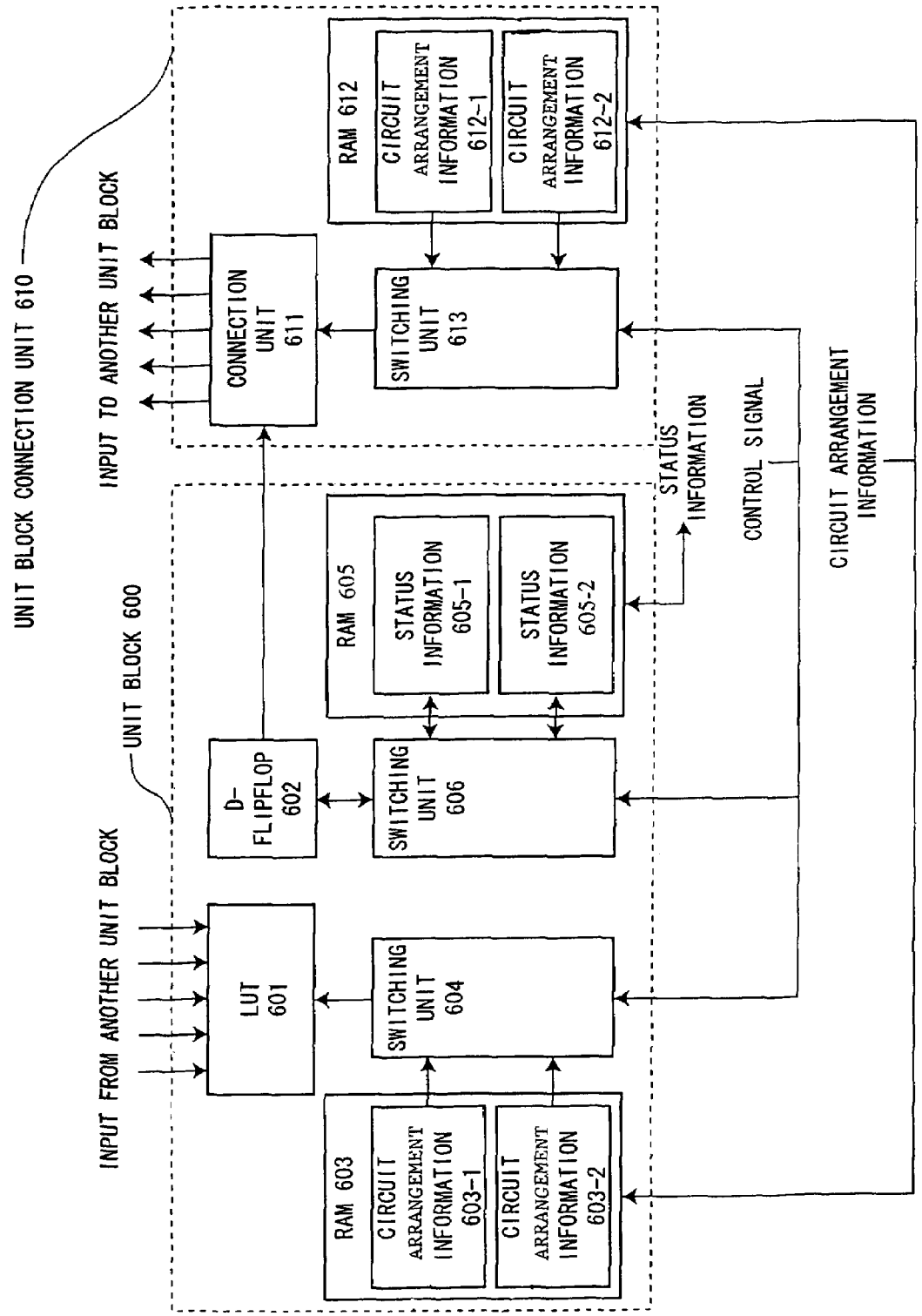
FIG. 6 is a high level block diagram for schematically showing an exemplary internal arrangement of a programmable logic circuit.

FIG. 6 indicates an outline of an exemplary internal structure of the programmable logic circuit 121. The programmable logic circuit 121 is equipped with a plurality of unit blocks 600 and a plurality of unit block-to-block connecting units 610. The unit block-to-block connecting units 610 connect the unit blocks 600 to each other. The unit block 600 is equipped with an LUT 601 and a D-FlipFlop 602. The LUT 601 executes a logic calculation with respect to inputted data. The D-FlipFlop 602 is used to establish a synchronization of an output when a calculation result of the LUT 601 is outputted to another unit block. The unit block 600 has a RAM 603 for storing a plurality of circuit arrangement information, and a switching unit 604 for switching circuit arrangement information which is applied to the LUT 601. The unit block 600 also has a RAM 605 and a switching unit 606. The RAM 605 is used to migrate/restore status information of the D-FlipFlop 602 when the circuit arrangement information applied to the LUT 601 is switched. The switch unit 606 switches the status information which is migrated/restored.

The unit block-to-block connecting unit 610 has a connection unit 611, a RAM 612, and a switching unit 613. The connection unit 611 outputs information from the unit block 600 to another unit block 600 based on circuit arrangement information related to a connection relationship between the unit blocks. The RAM 612 stores a plurality of circuit arrangement information which define a connection relationship among the unit blocks. The switching unit 613 switches the circuit arrangement information which is applied to the connection unit 611.

The RAM 603 receives circuit arrangement information related to a logic calculation from an external source, and then stores the received circuit arrangement information. The RAM 612 receives circuit arrangement information related to a connection relationship among the unit blocks from an external source, and then stores the received circuit arrangement information. The RAM 605 is used to receive/transfer status information with respect to an external source. Both the switching unit 604 and the switching unit 606 receive a control signal supplied from the control unit 123 so as to execute the switching operations of the circuit arrangement information which is applied to both the LUT 601 and the unit block-to-block connecting unit 610. The switching unit 606 migrates the status information of the D-FlipFlop 602 to the RAM 605 by receiving a control signal from the external source, and supplies the status information related to such a circuit which is subsequently operated to the D-FlipFlop 602.

It should also be noted that this embodiment has described that the LUT 601 executes the logic calculation. Alternatively, the LUT 601 may execute an arithmetic calculation and also may execute a simple program code.

Figure 7:
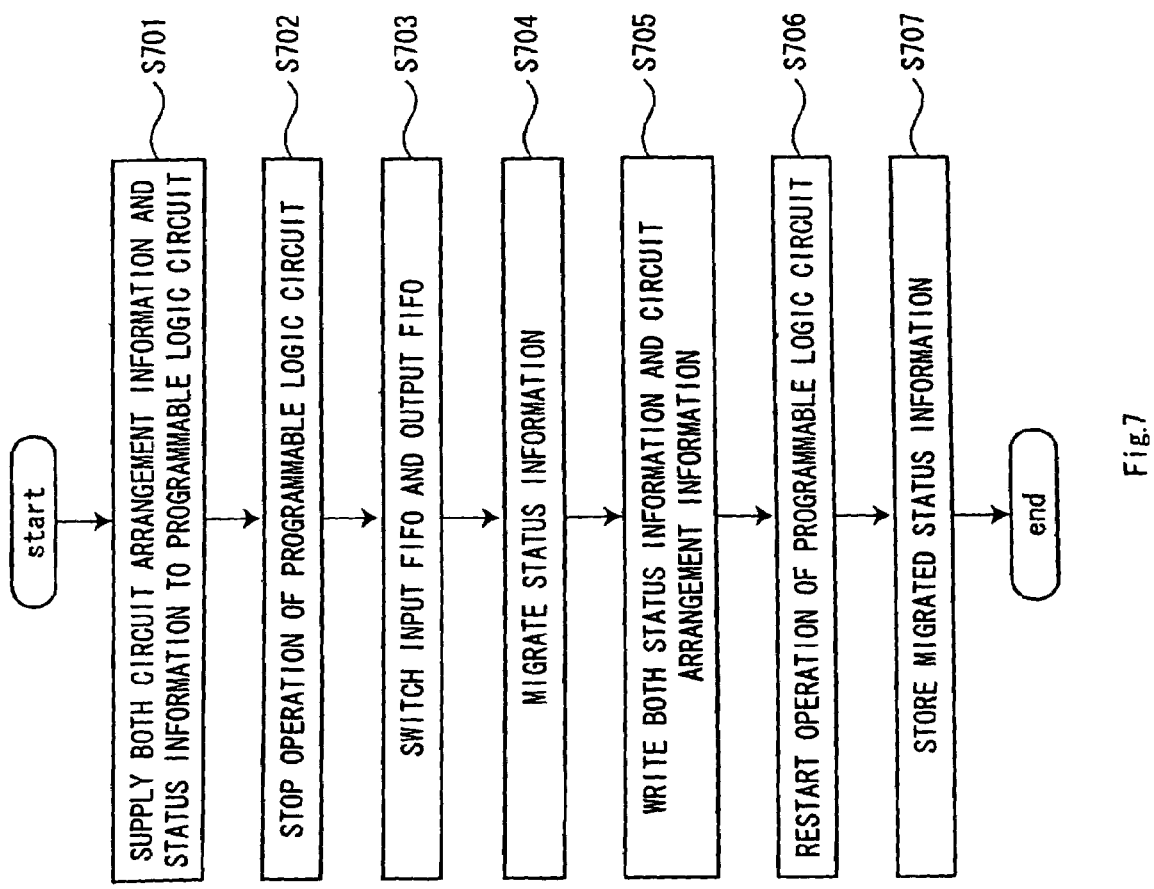
FIG. 7 is a flow chart for explaining a reconfiguring operation of a circuit arrangement of the programmable logic circuit.

FIG. 7 is a flow chart for explaining a sequential operation of the execution of a reconfiguring operation while the programmable logic circuit 121 is being operated.

In a step S701, the control unit 123 supplies circuit arrangement information 603-2 from an external source (not shown) to the RAM 603. The control unit 123 also supplies circuit arrangement information 612-2 from an external source (not shown) to the RAM 612. The circuit arrangement information 603-2 and 612-2 correspond to a configuration data of the circuit which will be subsequently operated. Also, the control unit 123 supplies status information 605-2 relating to the circuit which will be subsequently operated from the external source to the RAM 605. It should also be noted that in a case when the necessary data has already been stored in the RAM 603, the RAM 605, and the RAM 612, the process operation defined in this step S701 may be omitted.

In a step S702, the control unit 123 transmits a control signal to a clock signal supplying unit (not shown). The clock signal supplying unit stops supplying a clock signal to the programmable logic circuit 121 so as to stop the process operation.

In a step S703, the control unit 123 sends a control signal to the FIFO switching unit 122 in order to connect a FIFO (not shown in detail) to the programmable logic circuit 121. This FIFO relates to the circuit which will be subsequently operated.

In a step S704, the control unit 123 sends a control signal to the switching unit 606. The switching unit 606 migrates the status information which is held by the D-FlipFlop 602 to the RAM 605. The migrated status information is stored in the RAM 605 as status information 605-1.

In a step S705, the control unit 123 sends a control signal to the switching unit 604. The switching unit 604 copies the circuit arrangement information 603-2 from the RAM 603 to the LUT 601, when the circuit arrangement information 603-2 is related to an arrangement of a circuit which will be subsequently operated. Also, the control unit 123 sends a control signal to the switching unit 613. The switching unit 613 copies the circuit arrangement information 612-2 from the RAM 612 to the connection unit 611, while the circuit arrangement information 612-2 is related to a connection relationship of the circuit which will be subsequently operated. Furthermore, the control unit 123 sends a control signal to the switching unit 606. The switching unit 606 restores the status information 605-2 on the D-FlipFlop 602, while the status information 605-2 corresponds to the circuit which will be subsequently operated.

The operation of the programmable logic circuit is restarted in step S706. In a step S707, the control unit 123 sends a control signal to the clock signal supplying unit. The clock signal supplying unit restarts to supply the clock signal to the programmable logic circuit 121. Also, if required, the control unit 123 may alternatively send a control signal to the switching unit 606 so as to store the status information 605-1 which has been migrated to the RAM 612 into an external memory (not shown).

The circuit arrangement of the programmable logic circuit 121 is reconfigured in accordance with the above-explained sequential operation.

Due to the effects of the RAMs 603, 605, and 612, the time required to load the circuit arrangement information to the programmable logic circuit 121 can be shielded. As a consequence, the programmable logic circuit 121 can reconfigure the circuit arrangement in a high speed. It should also be understood that although the respective embodiments have employed the RAMs 603, 605, and 612, these RAM 603 and the like may not be necessarily required. That is, even when the programmable logic circuit 121 is arranged so that the circuit arrangement information and the status information may be transmitted/received in a high speed from an external source, the above-explained reconfiguration of the circuit arrangement may be realized.

Also, in FIG. 6, a total number of the circuit arrangement information and the status information, which have been stored in the RAMs 603, 605, and 612 is 2. Alternatively, more than two pieces of the circuit arrangement information and status information may be stored. Further, a total number of the circuit arrangement information and the status information, which can be stored in the RAMs 603, 605, and 612, may be determined in response to transmission/reception speeds of the circuit arrangement information and the status information with respect to the external source.

FIRST EXEMPLARY EMBODIMENT OF A LOGIC CIRCUIT APPARATUS

Figure 8:
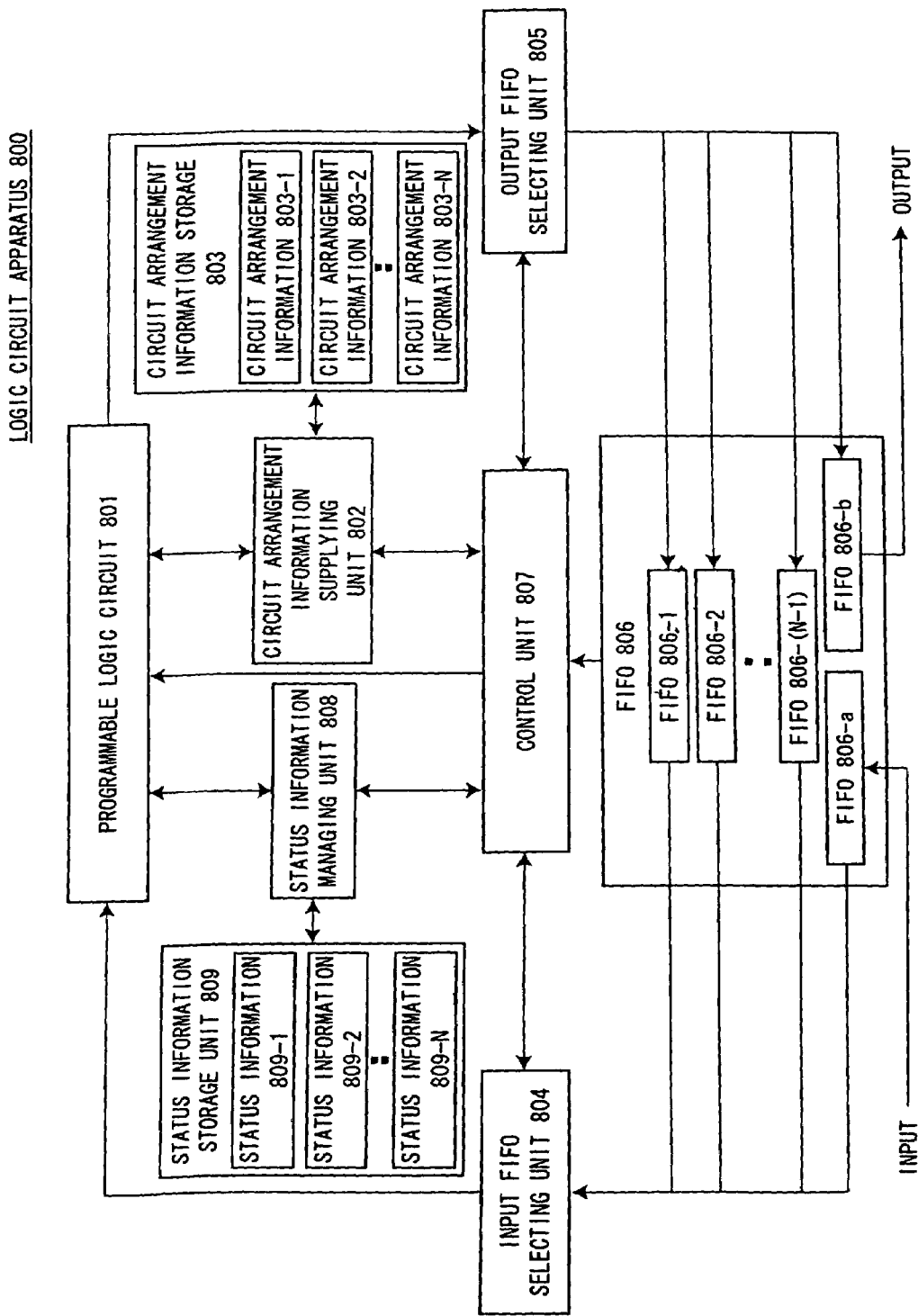
FIG. 8 is a block diagram of a logic circuit apparatus according to a first embodiment of the present invention.

FIG. 8 is a block diagram showing a logic circuit apparatus 800 of a first exemplary embodiment of the present invention. This logic circuit apparatus 800 has a programmable logic circuit 801, a circuit arrangement information supplying unit 802, and a circuit arrangement information storage unit 803. The programmable logic circuit 801 is arranged by combining a plurality of the unit blocks 600 with a plurality of unit block-to-block connecting units 610, as shown in FIG. 6. The circuit arrangement information supplying unit 802 supplies circuit arrangement information to the programmable logic circuit 801. The circuit arrangement information storage unit 803 stores circuit arrangement information. This circuit arrangement information is used when the programmable logic circuit 801 constitutes the respective unit circuits.

The logic circuit apparatus 800 according to this first exemplary embodiment has a FIFO 806, an input FIFO selecting unit 804, and an output FIFO selecting unit 805. The FIFO 806 connects the respective unit circuits to each other, which are realized by the programmable logic circuit 801. The input FIFO selecting unit 804 selects the FIFO which is connected to input sides of the respective unit circuits realized in the programmable logic circuit 801 from the FIFO 806. The output FIFO selecting unit 805 selects the FIFO which is connected to output sides of the respective unit circuits realized by the programmable logic circuit 801 from the FIFO 806. Both the input FIFO selecting unit 804 and the output FIFO selecting unit 805 correspond to the above-explained FIFO switching unit 122.

The logic circuit apparatus 800 of this first exemplary embodiment has a status information managing unit 808 and a status information storage unit 809. The status information managing unit 808 manages status information of the programmable logic circuit 801. The status information storage unit 809 stores status information.

The programmable logic circuit 801 is operated in such a manner that the circuit arrangement thereof is reconfigured as any of "N" pieces of unit circuits dynamically. Each of the unit circuits realized by the programmable logic circuit 801 reads data which is required for the process operation of each of the unit circuits via the input FIFO selecting unit 804 from the FIFO 806, and writes data of a process result obtained by each of the unit circuits into the output FIFO selecting unit 805. The programmable logic circuit 801 changes the circuit arrangement by receiving a control signal supplied from the control unit 807. For the sake of an easy explanation, the below-mentioned initial conditions are provided:

(A1) All of the unit circuits are series-connected to each other.
(A2) All of the unit circuits correspond to a 1-input/1-output unit circuit.
(A3) An entire portion of the logic circuit apparatus 800 corresponds to an 1-input/1-output circuit apparatus.

The circuit arrangement information supplying unit 802 reads the circuit arrangement information of the unit circuit designated by the control unit 807 from the circuit arrangement information storage unit 803, and then supplies the read circuit arrangement information to the programmable logic circuit 801.

The circuit arrangement information storage unit 803 stores thereinto circuit arrangement information 803-1, 803-2, ..., 803-N, which correspond to "N" pieces of the unit circuits. The unit circuit that the programmable logic circuit 801 realizes by employing circuit arrangement information 803-$k$ will be referred to as a unit circuit 803-$k$. Also, for the sake of a simple explanation, the below-mentioned initial conditions are provided in addition.

(A4) In the logic circuit apparatus 800 of this first exemplary embodiment, a k-th unit circuit located from the input side of the entire logic circuit apparatus 800 corresponds to a unit circuit 803-$k$ ($k=1, 2, ..., N$). As a consequence, a unit circuit 803-N locates at the nearest position with respect to the output side of the entire logic circuit apparatus 800.

The FIFO 806 contains "N−1" pieces of FIFOs (namely, FIFOs 806-1, 806-2 ..., 806-(N−1)) which connect "N" pieces of unit circuits to each other; a FIFO 806-$a$ corresponding to an input-sided FIFO of the entire circuit; and a FIFO 806-$b$ corresponding to an output-sided FIFO of the entire circuit. It should also be noted that for the sake of simple explanations, the following initial conditions are further provided.

(A5) A FIFO connected to the output side of the unit circuit 803-$k$ corresponds to a FIFO 806-$k$.
(A6) A FIFO connected to the input side of the unit circuit 803-(k+1) corresponds to a FIFO 806-$k$.
(A7) Capacities of the respective FIFOs 806 are equal to each other.

It should also be understood that the above-described FIFO 806 is not limited only to a first-in and first-out type dedicated memory, but also such a general-purpose memory element such as a DRAM which is arranged (otherwise is controlled) so as to be capable of being operated in a first-in and first-out manner.

The input FIFO selecting unit 804 selects an input FIFO from the FIFOs 806, while this input FIFO should be connected to the unit circuit designated by the control unit 807. Then, the input FIFO selecting unit 804 supplies data from the selected input FIFO to the programmable logic circuit 801.

The output FIFO selecting unit 805 selects an output FIFO from the FIFOs 806, while this output FIFO should be connected to the unit circuit designated by the control unit 807. Then, the output FIFO selecting unit 805 stores data outputted from the programmable logic circuit 801 in the output FIFO.

The status information managing unit 808 reads out status information as to the unit circuit designated by the control unit 807 from the status information storage unit 809, and then, supplies the read status information to the programmable logic circuit 801. Also, the status information managing unit 808 reads out status information of the unit circuit designated by the control unit 807 from the programmable logic circuit 801, and then stores the read status information in the status information storage unit 809.

The status information storage unit 809 stores thereinto status information 809-1, 809-2, ..., 809-N, which correspond to "N" pieces of the unit circuits, respectively. Such a status information corresponding to the circuit arrangement information 803-$k$ will be referred to as "status information 809-$k$" hereinafter.

Figure 9:
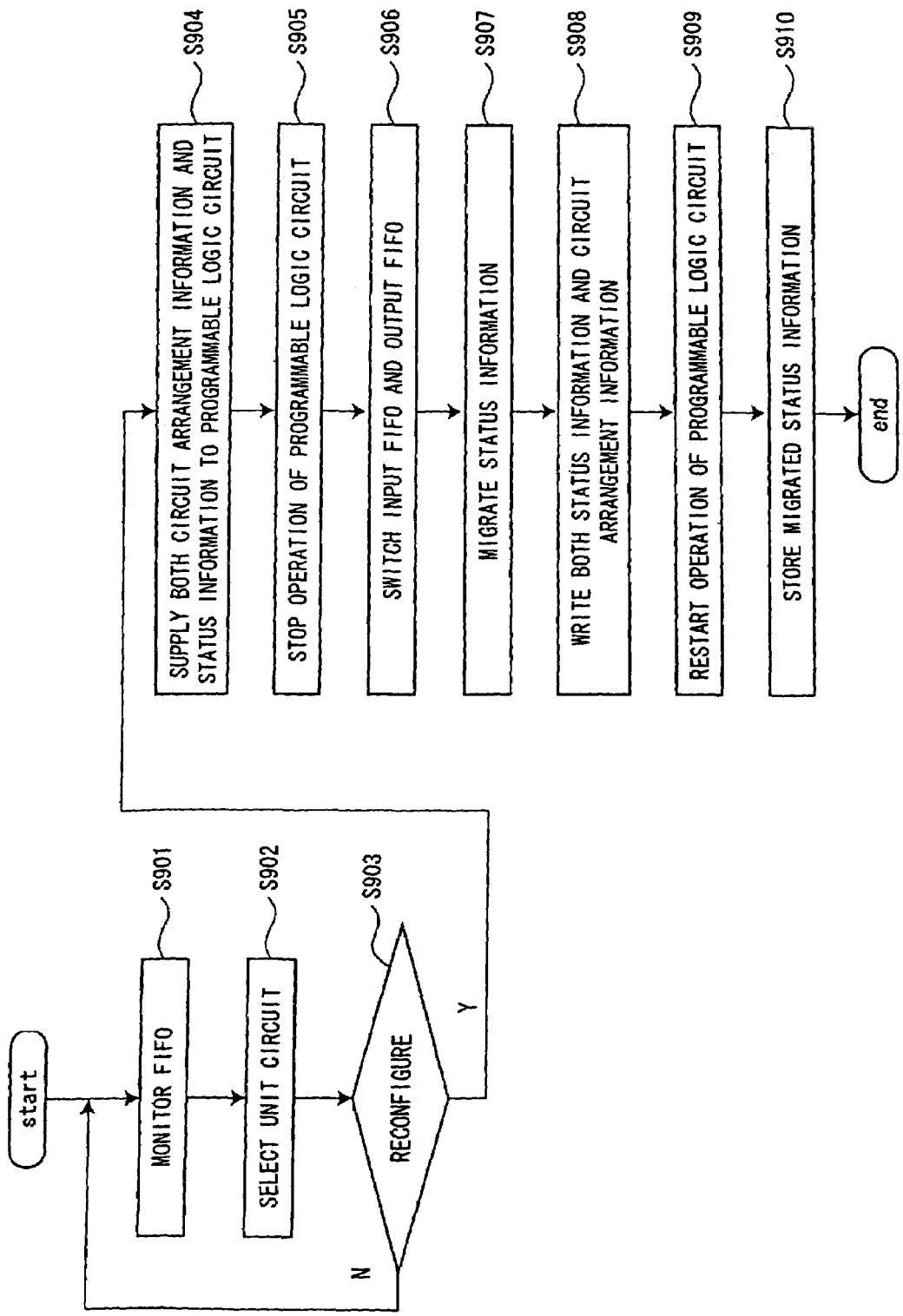
FIG. 9 is a flow chart of a unit circuit switching operation by a control unit provided in a logic circuit apparatus of a second embodiment of the present invention.

The control unit 807 monitors amounts of data which have been held by the respective FIFOs (FIFOs 806-1, 806-2, ..., 806-(N−1)); selects a unit circuit which is realized by the programmable logic circuit 801; and performs such a control operation when a unit circuit realized by the programmable logic circuit 801 is switched. Also, the control unit 807 stores an identifier of a unit circuit which is being operated in the programmable logic circuit 801. Referring now to FIG. 9, operations of the control unit 807 will be subsequently explained.

In a step S901, the control unit 807 monitors amounts of data which are held by the respective FIFOs of the FIFO 106 in a certain time interval. Although this time interval is constant in this first exemplary embodiment, for the sake of simple explanation, the time interval may be varied. For instance, while an upper limit of the time interval is established, the time interval may alternatively be made long in conjunction with such a condition that the operation time of the programmable logic circuit 101 becomes long. Alternatively, while the upper limit of the time interval is established, the time interval may be made long in connection with such a fact that either an average value or a total value of the amounts of the data held by the respective FIFOs is increased. Otherwise, every time data is read/written with respect to each of the FIFOs, or every time data are read/written predetermined times with respect to each of the FIFOs, the control unit 807 may alternatively monitor the amounts of the data held in the respective FIFOs.

In a step S902, the control unit 807 selects a unit circuit which is realized in the programmable logic circuit 101 based on amounts of data held by the respective FIFOs. The control unit 807 selects the unit circuit based on the capacities of the respective FIFOs, the data amount of the input FIFO of the respective unit circuit which is calculated from the data amounts held by the respective FIFOs, and an empty capacity of the output FIFO.

When the input FIFO is set under empty status, since input data is not present, the respective unit circuits cannot execute process operations. Also, when the output FIFO is set under full status, a newly produced process result is lost.

Therefore, the control unit 807 selects a unit circuit based on the monitored results of the respective FIFOs. The control unit 807 selects in such a manner that a data amount held by an input FIFO thereof is larger than, or equal to a predetermined threshold value "$T_{in}$", and further, availability of an output FIFO thereof is larger than, or equal to a predetermined threshold value "$T_{out}$."

In a step S903, the control unit 807 checks as to whether or not the selected unit circuit is identical to the unit circuit which is presently operated in the programmable logic circuit 801. The control unit 807 compares the identifier of the unit circuit which is presently operated in the programmable logic circuit 801 with the identifier of the unit circuit which has been selected in the step S902 by the control unit 807. The control unit 807 executes a process operation defined in the next step, when the above-explained two identifiers are the same, because a switching operation is not required.

In a step S904, the control unit 807 supplies both circuit arrangement information and status information of the selected unit circuit to the programmable logic circuit 801. The control unit 807 transmits the identifier of the selected unit circuit to both the circuit arrangement information supplying unit 802 and the status information managing unit 808.

When the identifier is transmitted from the control unit 807 to the circuit arrangement information supplying unit 802, the circuit arrangement information supplying unit 802 reads out circuit arrangement information of such a unit circuit corresponding to the notified identifier from the circuit arrangement information storage unit 803, and then supplies the read circuit arrangement information to the programmable logic circuit 801. Then, the circuit arrangement information supplying unit 802 stores the circuit arrangement information in the RAM 603. When the supply of the circuit arrangement information is accomplished, the circuit arrangement information supplying unit 808 notifies this completion to the control unit 807.

When the identifier of the circuit arrangement information is transmitted from the control unit 807 to the status information managing unit 808, the status information managing unit 808 reads out status information of such a unit circuit corresponding to the notified identifier from the status information storage unit 809, and then supplies the read circuit arrangement information to the programmable logic circuit 801. Then, the status information managing unit 808 stores the circuit arrangement information into the RAM 605 of the programmable logic circuit 801. When the supply of the status information is accomplished, the status information managing unit 808 notifies the control unit 807.

When the control unit 807 receives both the notification from the circuit arrangement information supplying unit 802 and the notification from the status information supplying unit 808, the control unit 807 executes a process operation defined in the next step.

In a step S905, the control unit 807 stops the operation of the programmable logic circuit 801. The control unit 807 controls the clock signal supplying unit (not shown) so as to stop the supply of the clock signal.

In a step S906, the control unit 807 transmits the identifier of the selected unit circuit to both the input FIFO selecting unit 804 and the output FIFO selecting unit 805. Both the input FIFO selecting unit 804 and the output FIFO selecting unit 805 connect such FIFOs corresponding to the identifier notified from the control unit 807 to the programmable logic circuit 801.

In a step S907, the control unit 807 controls the switching unit 606 to store a present status of the D-FlipFlop 602 in RAM 605.

In a step S908, the control unit 807 controls the switching unit 604 to supply a circuit arrangement information of the unit circuit which will be subsequently operated to the LUT 201, while this circuit arrangement information has been stored in the RAM 603. The control unit 807 controls the switching unit 613 to supply a circuit arrangement information of the unit circuit which will be subsequently operated to the connection unit 611, while this circuit arrangement information has been stored in the RAM 612. The control unit 807 controls the switching unit 606 to supply a status information of the unit circuit which will be subsequently operated to the D-FlipFlop 602, while this status information has been stored in RAM 605.

In a step S909, the control unit 808 restarts the operation of the programmable logic circuit 801. In other words, the control unit 808 controls the clock signal supplying unit (not shown) to restart the supply of the clock signal.

In a step S910, the control unit 808 controls the switching unit 606 to supply the status information which has been stored in RAM 605 in step S907 to the status information managing unit 808. The control unit 807 transmits an identifier of the unit circuit which has been operated just before the step S910 to the status information managing unit 808, and stores the status information of this notified unit circuit. The status information managing unit 108 stores status information applied from the switching unit 606 in the status information storage unit 809.

As previously described, in accordance with the logic circuit apparatus of this embodiment, even in such a case that the process capability which is required by each of the unit circuits is dynamically changed, this logic circuit apparatus can automatically adjust the distribution of the processing time.

SECOND EXEMPLARY EMBODIMENT OF A LOGIC CIRCUIT APPARATUS

Next, a description is made of a logic circuit apparatus 800 according to a second exemplary embodiment of the present invention. Since an arrangement of the logic circuit apparatus 800 of this second exemplary embodiment is similar to that of the first embodiment, an explanation thereof is omitted. In this exemplary second embodiment, a selecting process operation (step S902) of a unit circuit, which is executed by the control unit 807, is different from that of the first exemplary embodiment.

In this second exemplary embodiment, priority degrees of the respective unit circuits are evaluated by four stages defined from a priority degree 1 up to a priority degree 4. The priority degree 1 corresponds to the highest priority degree. The priority degree 4 indicates a process impossible status. The control unit 807 of this second exemplary embodiment selects a unit circuit having the highest priority degree.

Figure 10:
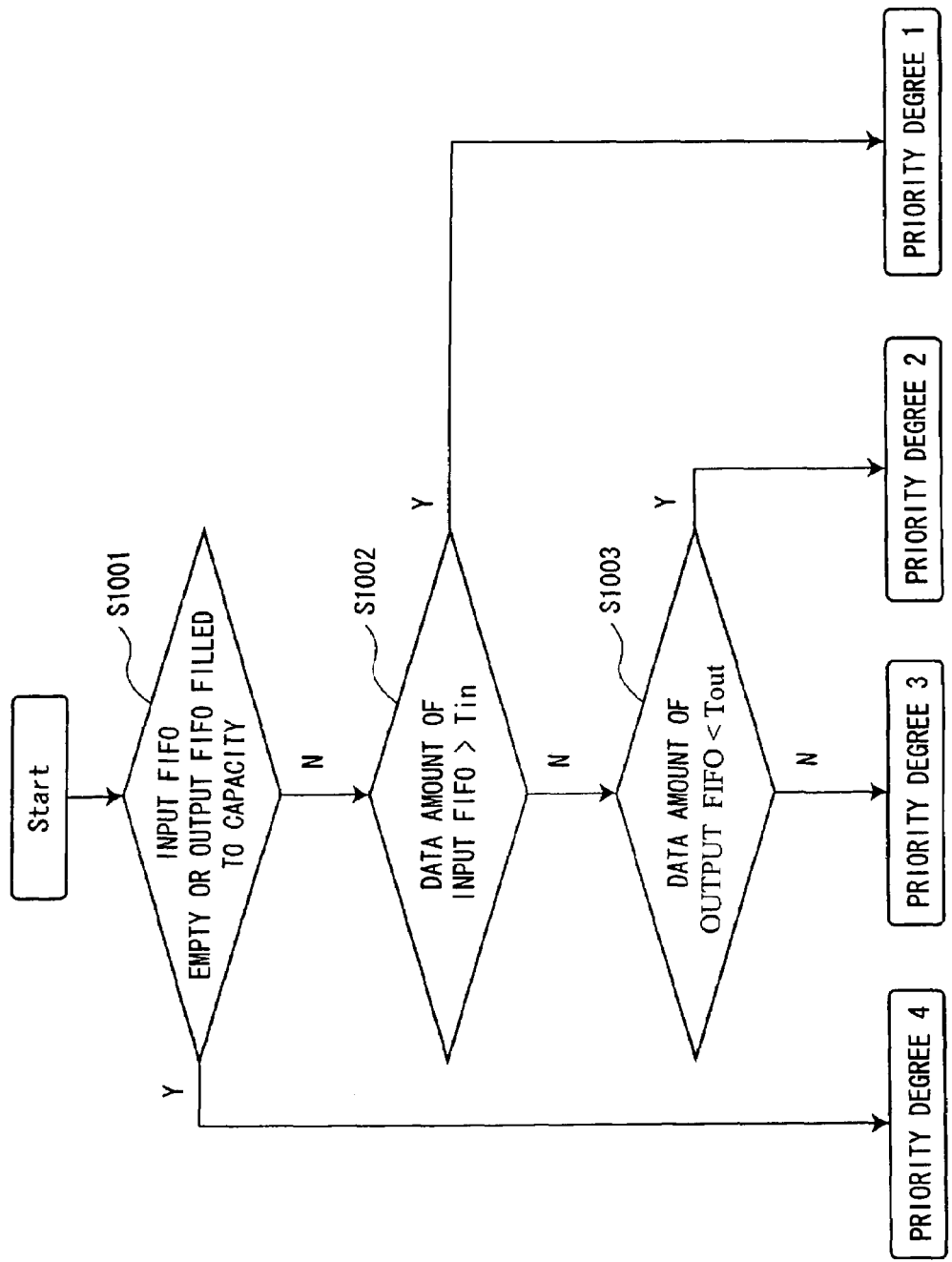
FIG. 10 is a flow chart for calculating a priority order of the respective unit circuit by the control unit of the logic circuit apparatus according to the second embodiment.

FIG. 10 is a flow chart for explaining a priority degree determining process operation of a unit circuit by the control unit 807 of this second exemplary embodiment. The control unit 807 sets priority degrees of all of the unit circuits based on the below-mentioned flow chart.

In a step S1001, when an amount of data held by an input FIFO is equal to 0, or an amount of data held by an output FIFO is at full capacity, the process operation of the unit circuit by using this input or output FIFO is not executable. Therefore, the control unit 807 does not execute the process operation. The reasoning is the following: if data is not stored in the input FIFO, there is no data to be processed by the unit circuit, whereas if the output FIFO is filled to capacity with the data, then there is higher possibility that the process result is lost. Therefore, the control unit 807 sets the priority degree of this unit circuit to the lowest priority degree, namely the priority degree 4.

In a step S1002, in case an amount of data held by an input FIFO is larger than, or equal to a threshold value "$T_{in}$", there is certain possibility that the input FIFO of this unit circuit is filled to capacity with the data or likely to overflow. As a result, the control unit 807 sets a priority degree of this unit circuit to the maximum priority degree, namely the priority degree 1.

In a step S1003, in case an amount of data held by an output FIFO is smaller than, or equal to a threshold value "$T_{out}$", it is so conceivable that the output FIFO of this unit circuit has sufficient availability. As a result, the control unit 807 sets a priority degree of this unit circuit to the priority degree 2.

In a step S1004, in other cases than the above-explained cases, the control unit 807 sets a priority degree of this unit circuit to the priority degree 3.

It should also be noted that in the above-described step S1001 of this second embodiment, the amount of data held by the input FIFO is equal to zero, or the output FIFO is filled to capacity with data. Alternatively, while a certain threshold value is defined as a reference, a condition for a subject may be determined. For instance the judging reference may be alternatively determined in case the amount of data held by the input FIFO is smaller than a threshold value "$T_{min}$", or in case the amount of data held by the output FIFO is larger than another threshold value "$T_{max}$." At this time, a relationship between these threshold values may not always satisfy $T_{min} \leq T_{in}$, $T_{max} \geq T_{out}$.

After the priority degrees of all of the unit circuits have been set, the control unit 807 selects a unit circuit having the highest priority degree. However, even in case that there are plural sets of such unit circuits having the highest priority degrees, the control unit 807 selects one of these unit circuits having the highest priority degrees. In this case, the control unit 807 selects a unit circuit by executing the process operation shown in FIG. 11.

In a step S1101, the control unit 807 checks whether or not there is a unit circuit which is presently operated in the programmable logic circuit 801 in the unit circuits having the same priority degrees. Since the control unit 807 has stored the identifier of the unit circuit which is being operated, this control unit 807 may merely seek such a unit circuit having the same identifier as that of the stored identifier from the unit circuits which have been classified based on the priority degrees thereof. When the unit circuit which is presently operated is present, the control unit 807 selects this unit circuit.

In a step S1102, the control unit 807 calculates a continuous process capability amount of each of the unit circuits when the unit circuit which is presently operated is not present. Then, the control unit 807 selects a unit circuit with the highest continuous process capability amount. It should also be noted that a continuous process capability amount is defined as a smaller value selected from an amount of data held by an input FIFO and an availability of an output FIFO. Therefore, the control unit 807 calculates the continuous process capability amount in accordance with the below-mentioned manner.

In a step S1102-1, the control unit 807 compares the amount of data held by the input FIFO with the availability of the output FIFO.

In a step S1102-3, when the amount of data held by the input FIFO is larger than the availability of the output FIFO, the control unit 807 defines the availability of the output FIFO as the continuous process capability amount.

In a step S1102-2, when the availability of the output FIFO is larger than the amount of data held by the input FIFO, the control unit 807 defines the amount of data held by the input FIFO as the continuous process capability amount.

When the continuous process capability amount is calculated, the amount of data held by the input FIFO and the availability of the output FIFO may be multiplied by coefficients respectively. The coefficients may be defined by using a ratio of an amount of input data which is used by each of the unit circuits in a single process operation to an amount of output data which is outputted by each of the unit circuits in a single process operation so as to be adjusted. For instance, a unit circuit which compresses data outputs a smaller amount of data than that of inputted data. In this case, for example, after the amount of data held by the input FIFO is multiplied by a coefficient corresponding to an averaged compression ratio so as to be adjusted, the adjusted amount of data held by the input FIFO may be compared with the availability of the output FIFO. Then, when the amount of data held by the input FIFO after adjustment is larger than the availability of the output FIFO, the value after the adjustment as to the continuous process capability amount may be alternatively employed.

As previously explained, in accordance with the logic circuit apparatus of this second embodiment, after the priority degree is calculated based on both the data amount of the input FIFO and the data amount of the output FIFO of each of the unit circuits, the relevant unit circuit is selected. It is conceivable that both the data amount of the input FIFO and the data amount of the output FIFO may reflect the process capability which is required by each of the unit circuits. Therefore, the logic circuit apparatus of this second embodiment can automatically distribute the processing times in response to the process capability which is required by each of the unit circuits.

In addition, in accordance with the logic circuit apparatus of this second embodiment, the unit circuit which is presently operated is caused to be operated for as long as permitted. Therefore, the logic circuit apparatus of this second embodiment can reduce a total number of operation stopping actions required when the circuits are switched. As a result, the logic circuit apparatus of this second embodiment can suppress a reduction of the entire process capability of the logic circuit apparatus.

Figure 11:
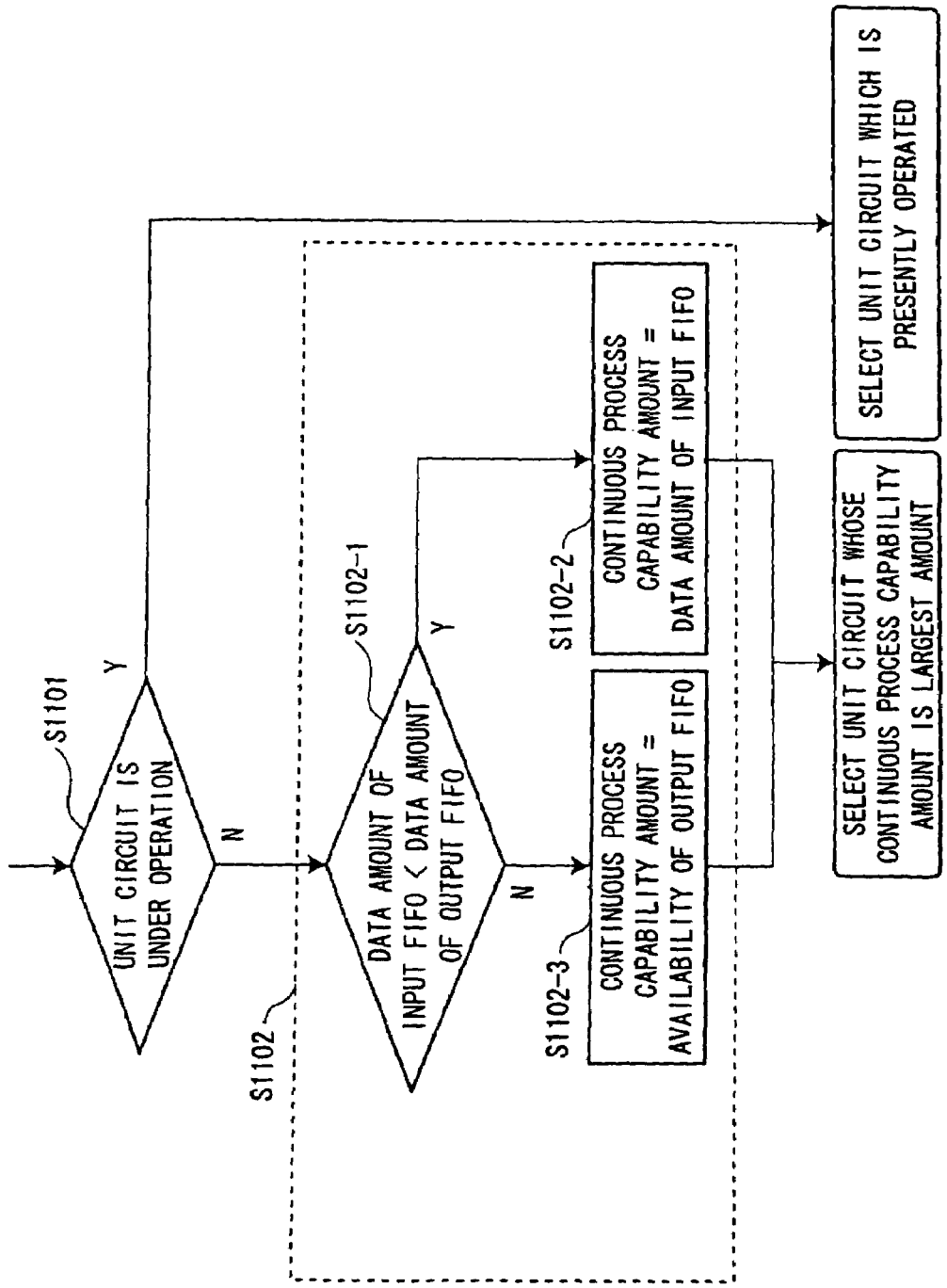
FIG. 11 is a flow chart showing a unit circuit selecting process operation by the control unit of the logic circuit apparatus of the second embodiment in case a plurality of unit circuits have the same priority.

It should be understood that in the above-explained process operation of FIG. 11 (namely, a process operation for selecting one unit circuit from a plurality of unit circuits having the same priority degrees), the below-mentioned judging operation may be further carried out. In other words, when a unit circuit which is presently operated is one of the plurality of unit circuits having the same priority degrees, if an operation time of this unit circuit is shorter than a threshold value "$T_{exe}$", then this unit circuit is selected. When a unit circuit which is presently operated is not any of the plurality of unit circuits having the same priority degrees, either, the process operation of the step S1102 may be carried out.

LOGIC CIRCUIT APPARATUS OF A THIRD EXEMPLARY EMBODIMENT

Figure 12:
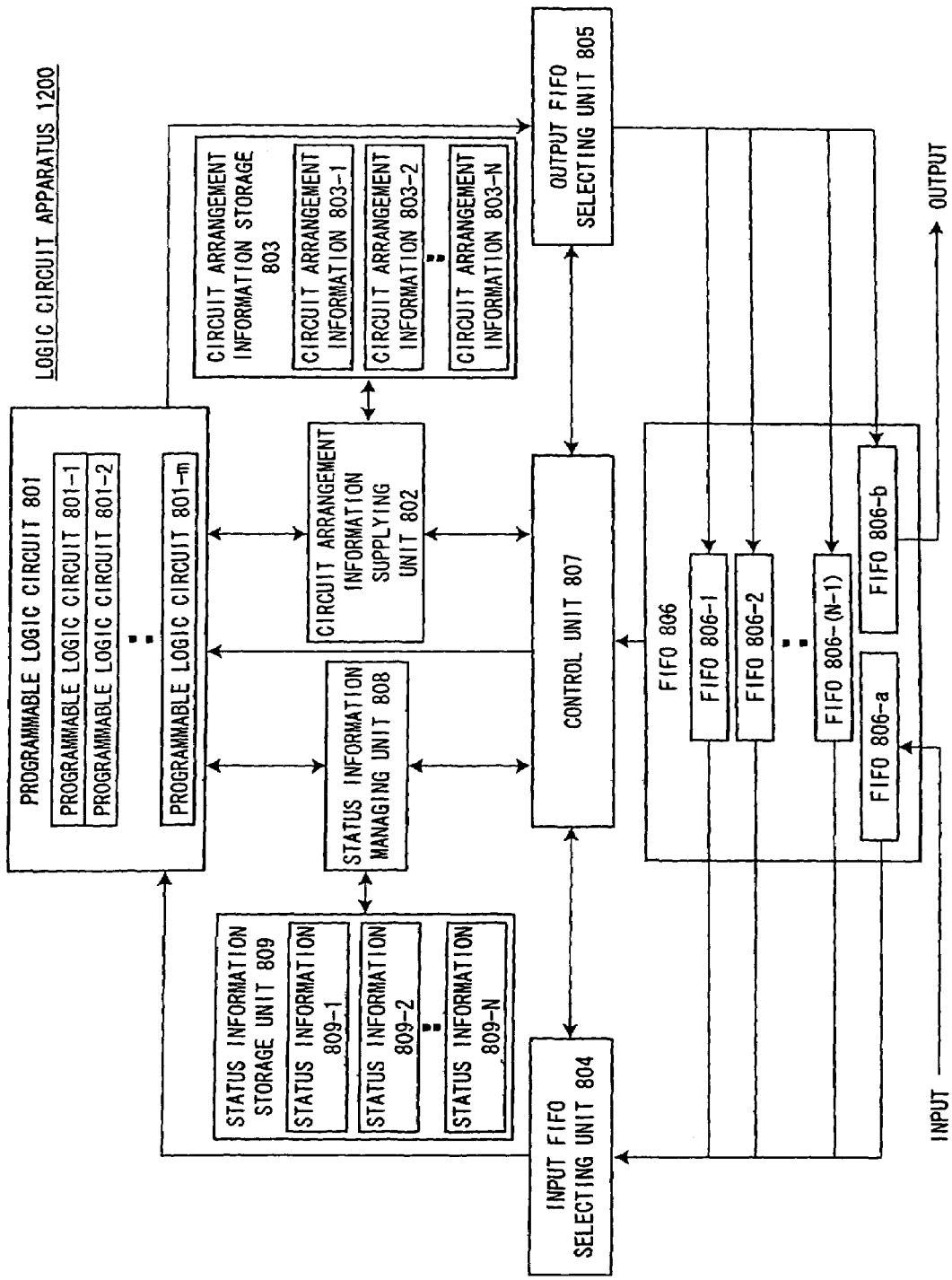
FIG. 12 is a block diagram of a logic circuit apparatus according to a third embodiment of the present invention.

A logic circuit apparatus according to a third embodiment of the present invention will now be described. A difference of this third exemplary embodiment from the first and second exemplary embodiments is a total number of programmable logic circuits. In this third exemplary embodiment, there are plural sets of programmable logic circuits. FIG. 12 indicates an arrangement of the logical circuit apparatus according to this third exemplary embodiment.

In this case, a plurality of unit circuits can be operated at the same time. In this third exemplary embodiment, the control unit 807 determines which unit circuit is operated by which programmable logic circuits 801-1, 801-2, ..., 801-*m*. The description of elements which are the same as those shown in FIG. 8 will be omitted. It should also be noted that when circuit arrangement information is applied to the logic circuit apparatus, a person may designate the circuit arrangement information. When the person designates the circuit arrangement information, a switching manner of the programmable logic circuits 801-1, 801-2, ..., 801-*m* may be switched similar to that of the first and second exemplary embodiments.

Also, in such a case that the control unit 807 determines which unit circuit is operated, the control unit 807 may determine priority degrees of the respective unit circuits in a similar manner to that of the second embodiment, and then, may select "m" pieces of unit circuits in this order of the higher priority degrees. When a total number of executable circuits is smaller than "m". pieces of the unit circuits, a portion of these programmable logic circuits may be brought to a rest status.

Figure 13:
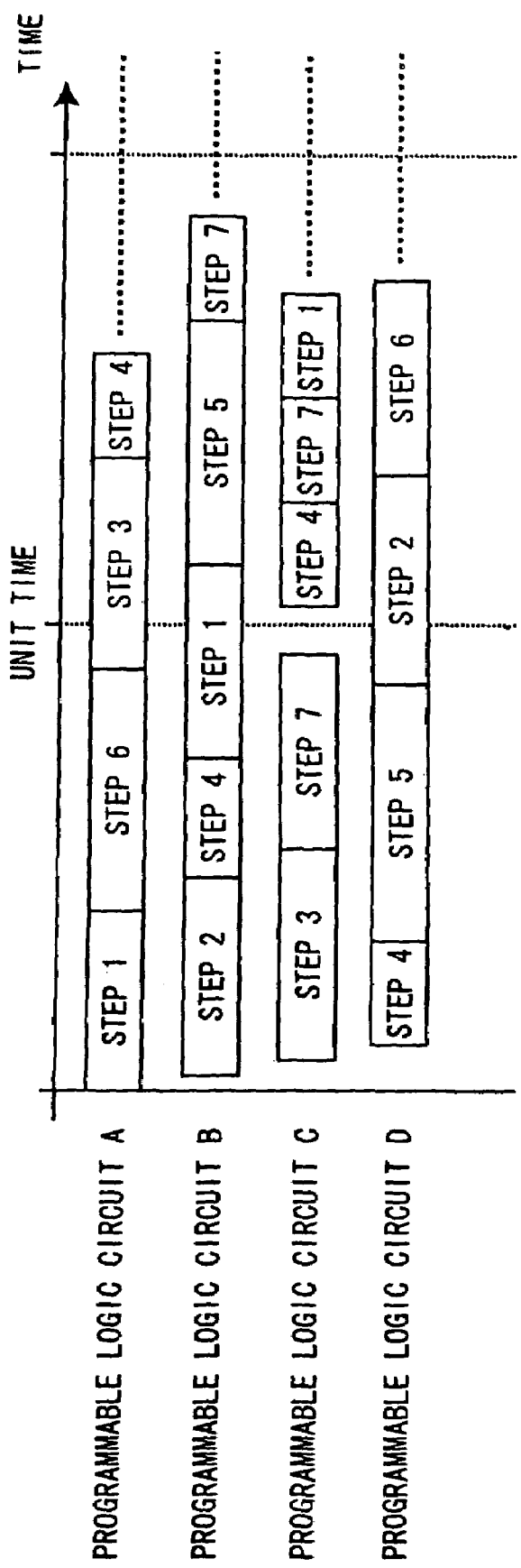
FIG. 13 is an example of a timing chart of the respective unit circuits in the case of the third embodiment.

FIG. 13 is a time chart for explaining operations in a case when a series of process operations constituted by 7 steps (steps 1, 2, ..., 7) is carried out by a logic circuit apparatus having 4 pieces of programmable logic circuits (namely, programmable logic circuits A, B, C, D). Step 1 corresponds to a step located at the nearest point to the input side among the 7 steps. Step 7 corresponds to a stage located at the nearest point to the output side. The stages defined from step 2 to step 6 are connected to each other in one column in the number order. The seven stages are realized by 7 pieces of unit circuits. FIG. 13 shows an example of time changes during which the respective steps are carried out by the programmable logic circuit.

In accordance with the logic circuit apparatus of this third exemplary embodiment, a single unit circuit may be alternatively executed over a plurality of programmable logic circuits. In other words, since there is a possibility that even when the single unit circuit cannot be executed by one programmable logic circuit, but the single unit circuit can be executed by another programmable logic circuit, the process capability of the programmable logic circuit can be effectively utilized. Therefore, the process capability can be easily allocated to the respective unit circuits.

It should also be noted that this third exemplary embodiment has a plurality of programmable logic circuits. Alternatively, when a large-sized programmable logic circuit is prepared, this large-sized programmable logic circuit may be subdivided and the subdivided programmable logic circuits may be used.

MODIFICATION

The control unit 807 may obtain the priority degree of each unit circuit by using a function or a conversion-table which is calculated from, for example, a data amount of input FIFO, an availability of an output FIFO or an operating time of each unit circuit.

In addition, a check as to whether or not a unit circuit is under operation, an operating time, and a continuous process capability amount may be evaluated at a stage for calculating a priority degree. For example, a condition as to whether or not the unit circuit is under operation may alternatively cause a priority degree to be changed by one stage.

In addition, in the above-described step S1001, the control unit 807 judges the process operation is not executable when the data amount of the input FIFO is equal to zero, or the output FIFO is filled to capacity with data. Alternatively, this judgment may be made based on a threshold value. The control unit 807 judges the process operation is not executable when, for example, the data amount of the input FIFO is smaller than, or equal to the threshold value "$T_{empty}$", or the empty capacity of the output FIFO is smaller than, or equal to the threshold value "$T_{full}$". That is to say, in the case when the input FIFO is under empty status, or under an approximately empty status, or in the case when the output FIFO is under full status, or under an approximately full status, no process operation is carried out.

APPLICATION EXAMPLE

Figure 14:
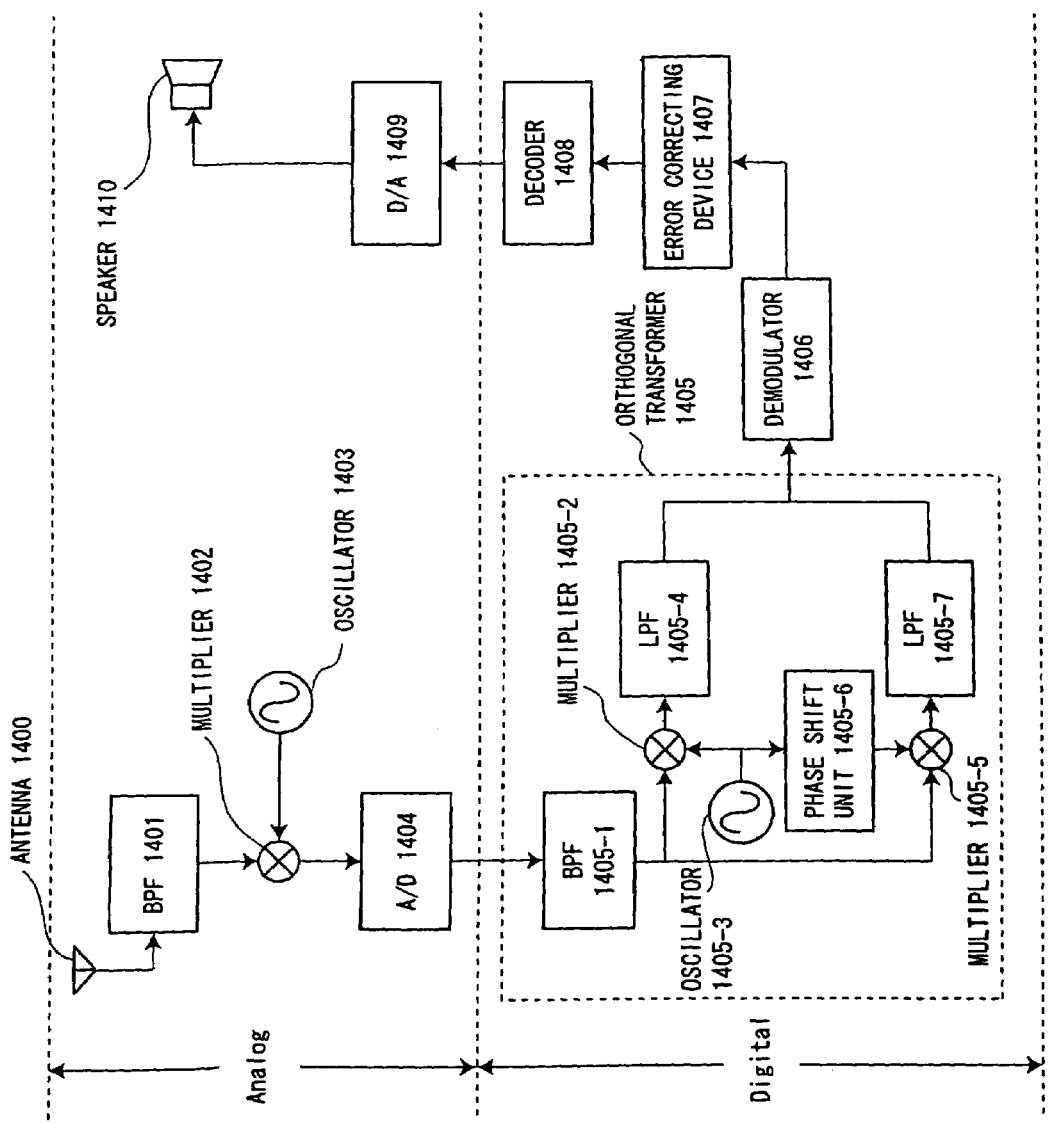
FIG. 14 is a block diagram of a wireless receiver arranged as an application example of the logic circuit apparatus of an embodiment of the present invention.

Referring now to drawings, a description is made of an example in which a logic circuit apparatus according to one embodiment of the present invention has been applied to a digital circuit of a wireless receiver (radio receiver). FIG. 14 is a block diagram of the wireless receiver.

This wireless receiver has an antenna 1400, a band pass filter 1401, an oscillator 1403, a multiplier 1402, and an A/D converter 1404. The antenna 1400 receives electromagnetic waves. The band pass filter 1401 extracts a signal having a specific frequency band from the received electromagnetic waves. The multiplier 1402 multiplies a signal from the oscillator 1403 by an output signal from the band pass filter 1401. The A/D converter 1404 converts to a digital signal an output signal from the multiplier 1402.

This wireless receiver also has a orthogonal transformer 1405, a demodulator 1406, an error correcting device 1407, and a decoder 1408. The orthogonal transformer 1405 transforms to an orthogonal-transformed signal the digital signal from the A/D converter 1404. The demodulator 1406 demodulates the orthogonal-transformed signal to obtain coded data. The error correcting device 1407 corrects errors contained in the coded data. The decoder 1408 decodes the coded data from the error correcting device 1407 to obtain voice data.

The wireless receiver is further equipped with a D/A converter 1409 and a speaker 1410. The D/A converter 1409 converts the voice data, which is digital signal, to the voice signal which is an analog signal. The speaker 1410 produces voice based on the voice signal.

The band pass filter 1401, the multiplier 1402, the oscillator 1403, the A/D converter 1404, and the D/A converter 1409 correspond to analog circuits. The orthogonal transformer 1405, the demodulator 1406, the error correcting device 1407, and the decoder 1408 correspond to digital circuits.

The orthogonal transformer 1405 has a band pass filter 1405-1, an oscillator 1405-3, a multiplier 1405-2, and a low pass filter 1405-4. The band pass filter 1405-2 passes data from the A/D converter 1404 having a specific frequency component contained in the digital data. The multiplier 1405-2 multiplies the data outputted from the band pass filter by a value produced based on the signal from the oscillator 1405-3. The low pass filter 1405-4 passes data having a component lower than, or equal to the specific frequency contained in the data derived from the multiplier 1405-2.

The orthogonal transformer 1405 has a phase shift unit 1405-6, a multiplier 1405-5, and a low pass filter 1405-7. The phase shift unit 1405-6 shifts a phase of a signal from the oscillator 1405-3 by $\pi/2$. The multiplier 1405-5 multiplies the data from the band pass filter 1405-1 by a value produced based on the signal from the phase shift unit 1405-6. The low pass filter 1405-7 passes data from the multiplier 1405-5 having a component lower than, or equal to the specific frequency contained in the data. The output of the low pass filter 1405-4 and the output of the low pass filter 1405-7 constitute the output of the orthogonal transformer 1405.

Figure 15:
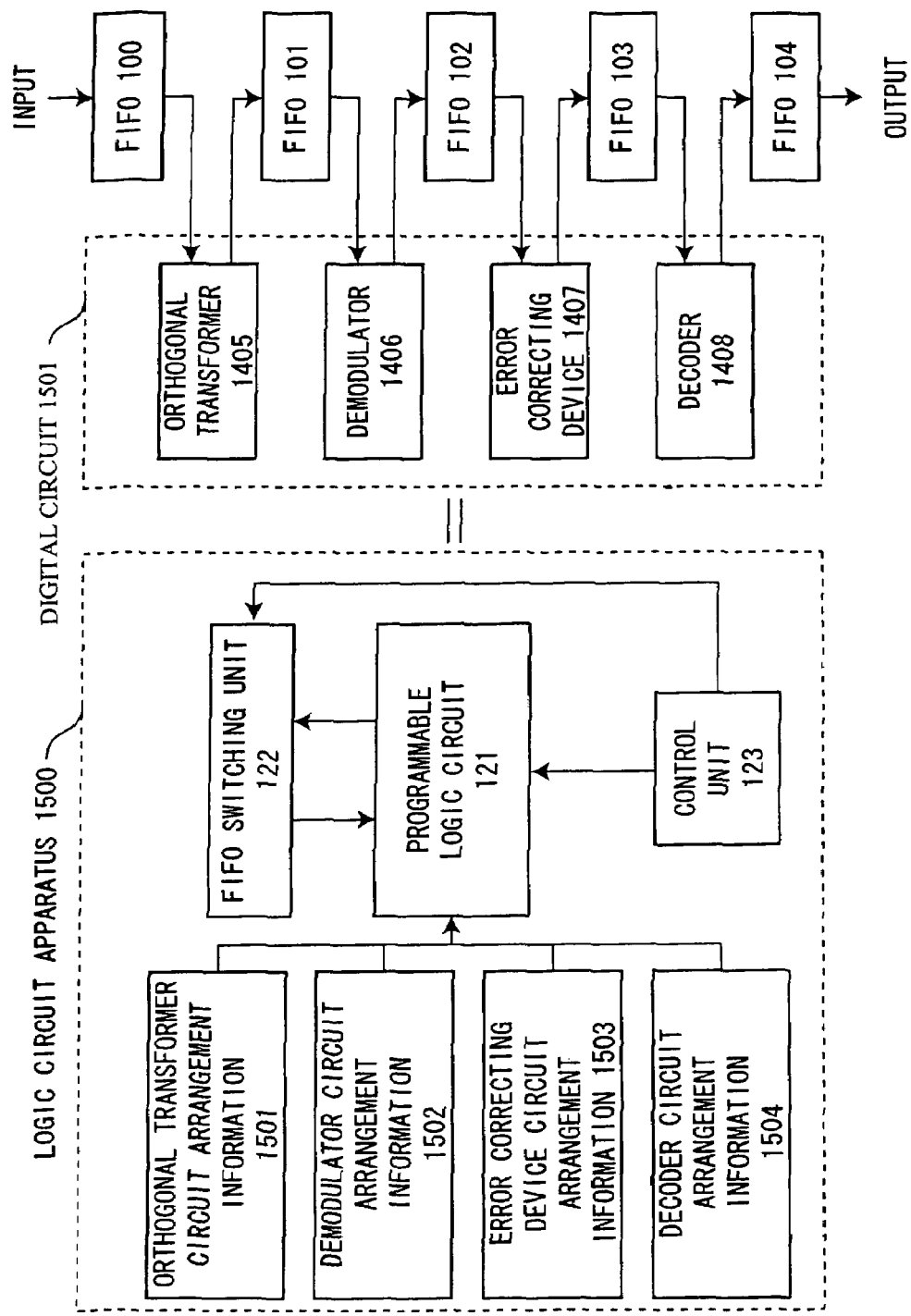
FIG. 15 is a block diagram indicating the overview of the digital circuit portion of the wireless receiver to which the logic circuit apparatus according to one embodiment of the present invention is applied.

The logic circuit apparatus 1500 according to one exemplary embodiment of the present invention is applied to the digital circuit portion of this wireless receiver. FIG. 15 is an explanatory diagram for explaining an outline as to the application of the logic circuit apparatus.

The digital circuit 1501 contains the orthogonal transformer 1405, the demodulator 1406, the error correcting device 1407, and the decoder 1408. The input/output of the respective circuits contained in the digital circuit 1501 are connected to each other via the FIFOs 100, 101, 102, 103, and 104.

The digital circuit 1501 is replaced by the logic circuit apparatus 1500 according to one embodiment of the present invention. The logic circuit apparatus 1500 according to one embodiment of the present invention contains circuit arrangement information 1501 corresponding to the orthogonal transformer 1405, circuit arrangement information 1502 corresponding to the demodulator 1406, circuit arrangement information 1503 corresponding to the error correcting device 1407, and circuit arrangement information 1504 corresponding to the decoder 1408. Instead of operating the respective circuit elements of the digital circuit 1501, the logic circuit apparatus 1500 is operated. The logic circuit apparatus 1500 is operated in a similar manner as explained from FIG. 2 to FIG. 5. That is to say, the control unit 123 causes the program logic circuit 121 to reconfigure a circuit arrangement, and further causes the FIFOs to be connected to the FIFO switching unit 122.

Figure 16:
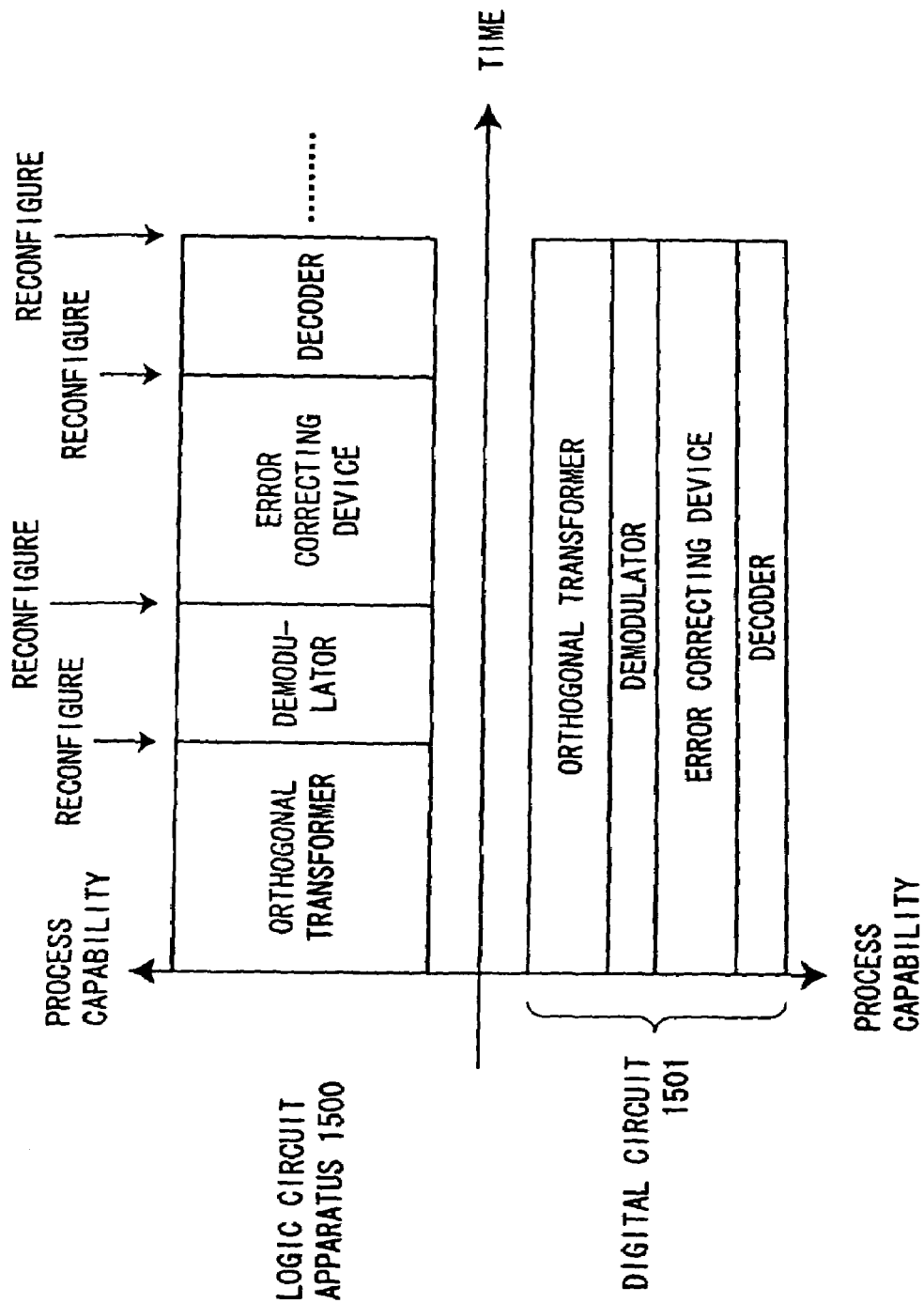
FIG. 16 is a timing diagram illustrating an example of a timing for the respective unit circuits when the logic circuit apparatus according to one embodiment of the present invention is applied to the digital circuit portion of the wireless receiver.

FIG. 16 illustrates an example of a relationship between process capability and times in a case when the digital circuit 1501 is operated, and in a case when the logic circuit apparatus 1500 is operated. FIG. 16 indicates that as the width along the axis of the process capability increases, the process capability increases. When the digital circuit 1501 is operated, the respective circuits are operated in a parallel mode. To the contrary, when the logic circuit apparatus 1500 is operated, process operations equivalent to the respective circuits are carried out in a time divisional mode. There is no difference in process amounts even when the digital circuit 1501 and the logic circuit apparatus 1500 is operated. In other words, even the logic circuit apparatus 1500 can execute a similar process operation to that of the digital circuit 1501.

It should also be understood that FIG. 16 exemplifies a case when the logic circuit apparatus 1500 is operated in this order of the orthogonal transformer, the demodulator, the error correcting device, and the decoder. However, since the operation sequence of these circuits is varied in response to data amounts stored in the FIFOs among the respective circuits, these circuits are not always operated in accordance with this sequence.

This application example has explained an example where the logic circuit apparatus according to one embodiment of the present invention is applied to the wireless receiver. Alternatively, this logic circuit apparatus may be applied not only to a wireless receiver, but also to a wireless transmitter based on the same technical idea. Alternatively, it is apparent that the logic circuit apparatus according to one exemplary embodiment of the present invention may be applied to other digital circuits, for example, digital circuits for encoding/decoding moving pictures and voice.

The merit of this application example is given as follows: That is, even in a wireless receiver which must be properly adapted to a plurality of communication systems, or a plurality of coding systems, these wireless receivers may be realized by merely preparing circuit arrangement information. In a case when the digital circuit 1501 is employed, the circuits must be prepared for every system. In a case when the logic circuit apparatus 1500 is employed, however, the circuits need not be prepared for every system. In a case when high process capability is required, as previously explained in the third embodiment, a plurality of programmable logic circuits 121 may be provided in the logic circuit apparatus 1500.

All embodiments of the present invention conveniently may be implemented using a conventional general purpose computer or micro-processor programmed according to the teachings of the present invention, as will be apparent to those skilled in the computer art. Appropriate software may readily be prepared by programmers of ordinary skill based on the teachings of the present disclosure, as will be apparent to those skilled in the software art. In particular, the computer housing may house a motherboard that contains a CPU, memory (e.g., DRAM, ROM, EPROM, EEPROM, SRAM, SDRAM, and Flash RAM), and other optional special purpose logic devices (e.g., ASICS) or configurable logic devices (e.g., GAL and reprogrammable FPGA). The computer also includes plural input devices, (e.g., keyboard and mouse), and a display card for controlling a monitor.

Additionally, the computer may include a floppy disk drive; other removable media devices (e.g. compact disc, tape, and removable magneto-optical media); and a hard disk or other fixed high density media drives, connected using an appropriate device bus (e.g., a SCSI bus, an Enhanced IDE bus, or an Ultra DMA bus). The computer may also include a compact disc reader, a compact disc reader/writer unit, or a compact disc jukebox, which may be connected to the same device bus or to another device bus.

Examples of computer readable media associated with the present invention include compact discs, hard disks, floppy disks, tape, magneto-optical disks, PROMs (e.g., EPROM, EEPROM, Flash EPROM), DRAM, SRAM, SDRAM, etc. Stored on any one or on a combination of these computer readable media, the present invention includes software for controlling both the hardware of the computer and for enabling the computer to interact with a human user. Such software may include, but is not limited to, device drivers, operating systems and user applications, such as development tools. Computer program products of the present invention include any computer readable medium which stores computer program instructions (e.g., computer code devices) which when executed by a computer causes the computer to perform the method of the present invention. The computer code devices of the present invention may be any interpretable or executable code mechanism, including but not limited to, scripts, interpreters, dynamic link libraries, Java classes, and complete executable programs. Moreover, parts of the processing of the present invention may be distributed (e.g., between (1) multiple CPUs or (2) at least one CPU and at least one configurable logic device) for better performance, reliability, and/or cost.

The invention may also be implemented by the preparation of application specific integrated circuits or by interconnecting an appropriate network of conventional component circuits, as will be readily apparent to those skilled in the art.

Any process descriptions or blocks in flow charts should be understood as representing modules, segments, or portions of code which include one or more executable instructions for implementing specific logical functions or steps in the process, and alternate implementations are included within the scope of the preferred embodiment of the present invention in which functions may be executed out of order from that shown or discussed, including substantially concurrently or in reverse order, depending on the functionality involved, as would be understood by those reasonably skilled in the art of the present invention.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiments of the invention without departing substantially from the spirit and principles of the invention. All such modifications and variations are intended to be included herein within the scope of this disclosure and the present invention and protected by the following claims.

What is claimed is:

1. A logic circuit apparatus comprising:
  a circuit arrangement information memory configured to store circuit arrangement information corresponding to each unit circuit of a plurality of unit circuits;
  a programmable logic circuit having a circuit arrangement which is dynamically reconfigurable using the circuit arrangement information;
  a plurality of process data memories, wherein a different pair of said process data memories is respectively provided for each of said unit circuits, one process data memory in each of said pairs being configured to store input data for a corresponding one of said unit circuits and a second process data memory in each of said pairs being configured to store output data for said corresponding one of said unit circuits; and
  a controller configured to monitor at least one of a storage amount of the input data, a storage amount of the output data and an amount of storage area availability in the process data memory for the output data corresponding to each unit circuit of the plurality of unit circuits, and to control reconfiguration of the circuit arrangement of the programmable logic circuit when at least one of the storage amounts satisfies a condition.

2. The apparatus of claim 1, wherein the controller is configured to monitor the storage amount of the input data corresponding to each unit circuit of the plurality of unit circuits, and to control the programmable logic circuit to reconfigure the circuit arrangement of the programmable logic circuit using the circuit arrangement information of a certain unit circuit which satisfies the following conditions,
  (A) the storage amount of input data corresponding to the certain unit circuit exceeds a threshold, and
  (B) the certain unit circuit is different from a current unit circuit currently configured on the programmable logic circuit.

3. The apparatus of claim 1, wherein
  the controller is configured to monitor the storage amount of said output data into said process data memory, and to control the programmable logic circuit to reconfigure the circuit arrangement of the programmable logic circuit using the circuit arrangement information of a certain unit circuit which satisfies the following conditions,
  (A) the storage amount of output data corresponding to the certain unit circuit is smaller than a threshold, and
  (B) the certain unit circuit is different from a current unit circuit currently configured on the programmable logic circuit.

4. The apparatus of claim 1, wherein
  the controller is configured to monitor both the storage amount of said input data corresponding to each unit circuit of the plurality of unit circuits and the storage amount of said output data corresponding to each unit circuit of the plurality of unit circuits, and to control the programmable logic circuit to reconfigure the circuit arrangement of the programmable logic circuit using the circuit arrangement information of a certain unit circuit which satisfies one of the following conditions,
  (A) the storage amount of input data corresponding to a current unit circuit currently configured on the programmable logic circuit is smaller than a first threshold, and
  (B) the storage amount of output data corresponding to the current unit circuit exceeds a second threshold.

5. The apparatus of claim 1, wherein
  the controller is configured to monitor both the storage amount of the input data and the amount of storage area availability in the process data memory for the output data corresponding to each unit circuit of the plurality of unit circuits, and to control the programmable logic circuit to reconfigure the circuit arrangement of the programmable logic circuit using the circuit arrangement information of a certain unit circuit which satisfies one of the following conditions,
  (A) the storage amount of input data corresponding to a current unit circuit currently configured on the programmable logic circuit is smaller than a first threshold, and
  (B) the amount of storage area availability in the process data memory for output data corresponding to the current unit circuit is smaller than a second threshold.

6. The apparatus of claim 1, wherein:
  the controller is configured to monitor both the storage amount of the input data and the storage amount of the output data of each unit circuit of the plurality of unit circuits,
  the controller further comprises a priority degree calculator configured to calculate priority-degrees of each unit circuit of the plurality of unit circuits using both the storage amount of the input data and the storage amount of the output data of each unit circuit of the plurality of unit circuits, and
  the controller is configured to control the programmable logic circuit to reconfigure the circuit arrangement of the programmable logic circuit using the circuit arrangement information of the unit circuit having a highest priority degree when the unit circuit having the highest priority degree is different from a current unit circuit currently configured on the programmable logic circuit.

7. The apparatus of claim 6, wherein the controller is configured to control the programmable logic circuit not to reconfigure the circuit arrangement of the programmable logic circuit when the current unit circuit has the highest priority degree.

8. The apparatus of claim 6, further comprising:
  a continuous processing capability estimator configured to estimate a continuous processing capability amount of each unit circuit of the plurality of unit circuits using both the storage amount of the input data and the storage amount of the output data of each unit circuit of the plurality of unit circuits,
  wherein the controller is configured to control the programmable logic circuit to reconfigure the circuit arrangement of the programmable logic circuit using the circuit arrangement information of the unit circuit having both the highest priority degree and a highest continuous processing capability.

9. The apparatus of claim 6, wherein the priority degree calculator is configured to allocate the highest priority degree to a unit circuit of the plurality of unit circuits corresponding to the unit circuit of the plurality of unit circuits having the storage amount of input data that exceeds a first threshold.

10. The apparatus of claim 9, wherein the priority degree calculator is configured to allocate a priority degree lower than the highest priority degree to the unit circuit of the plurality of unit circuits corresponding to both the unit circuit of the plurality of unit circuits having the storage amount of input data that is smaller than, or equal to the first threshold, and the storage amount of output data that is smaller than a second threshold.

11. The apparatus of claim 6, wherein the priority degree calculator is configured to allocate a lowest priority degree to a unit circuit of the plurality of unit circuits corresponding to at least one of the unit circuit of the plurality of unit circuits having the storage amount of input data that is smaller than a first threshold and the unit circuit of the plurality of unit circuits having the storage amount of output data that exceeds a second threshold.

12. The apparatus of claim 6, wherein the priority degree calculator is configured to allocate a lowest priority degree to a unit circuit corresponding to at least one of the unit circuit of the plurality of unit circuits having the storage amount of input data that is smaller than a first threshold and the unit circuit of the plurality of unit circuits having a storage area availability of output data in the process data memory that is smaller than a second threshold.

13. The apparatus of claim 1, wherein the process data memory corresponds to a FIFO type memory.

14. A timeshare operating method of a programmable logic circuit that allocates process capabilities among a plurality of unit circuits, the programmable logic circuit including a dynamically reconfigurable circuit arrangement which is reconfigurable using circuit arrangement information of each unit circuit of the plurality of unit circuits, the method comprising:
providing a plurality of memories, wherein a different pair of said memories is respectively provided for each of said plurality of unit circuits, storing in one memory of each of said pair of memories input data employed in a process operation of a corresponding unit circuit of the plurality of unit circuits, and storing in a second memory of each of said pair of memories output data generated by the process operation of said corresponding unit circuit of the plurality of unit circuits;
monitoring at least one of a storage amount of the input data, a storage amount of the output data and an amount of storage area availability in a memory for the output data corresponding to each unit circuit of the plurality of unit circuits;
selecting a unit circuit from the plurality of unit circuits based on at least one of an amount of stored input data and an amount of stored output data; and
reconfiguring the circuit arrangement of the programmable logic circuit using the circuit arrangement information of the selected unit circuit.

15. The method of claim 14 wherein:
monitoring monitors the storage amount of the input data corresponding to each unit circuit of the plurality of unit circuits; and
selecting selects a unit circuit from the plurality of unit circuits for the selected unit circuit which satisfies both of the following conditions (A) and (B):
(A) the storage amount of the input data corresponding to the selected unit circuit exceeds a threshold, and
(B) the selected unit circuit is different from a current circuit currently configured on the programmable logic circuit.

16. The method of claim 14 wherein:
monitoring monitors the storage amount of the output data corresponding to each unit circuit of the plurality of unit circuits; and
selecting selects a unit circuit from the plurality of unit circuits for the selected unit circuit which satisfies both of the following conditions (A) and (B):
(A) the storage amount of the output data corresponding to the selected unit circuit is smaller than a threshold, and
(B) the selected unit circuit is different from a current unit circuit currently configured on the programmable logic circuit.

17. The method of claim 14 wherein:
monitoring monitors both the storage amount of the input data and the storage amount of the output data of each unit circuit of the plurality of unit circuits; and
selecting selects a unit circuit from the plurality of unit circuits for the selected unit circuit which is different from a current unit circuit currently configured on the programmable logic circuit, when one of the following conditions (A) and (B) is satisfied:
(A) the storage amount of the input data corresponding to the current unit circuit is smaller than a first threshold, and
(B) the storage amount of output data of the current unit circuit exceeds a second threshold.

18. The method of claim 14 wherein:
monitoring monitors both the storage amount of the input data and the amount of storage area availability in the memory for the output data; and
selecting selects a unit circuit from the plurality of unit circuits for the selected unit circuit which is different from a current circuit currently configured on the programmable logic circuit, when one of the following conditions (A) and (B) is satisfied:
(A) the storage amount of the input data corresponding to the current unit circuit is smaller than a first threshold value, and
(B) the amount of storage area availability in the memory for the output data of the current unit circuit is smaller than a second threshold.

19. The method of claim 14, wherein the monitoring monitors both the storage amount of the input data and the storage amount of the output data of each unit circuit of the plurality of unit circuits, the method further comprising:
calculating priority degrees of each unit circuit of the plurality of unit circuits using the storage amount of the input data and the storage amount of the output data of each unit circuit of the plurality of unit circuits,
wherein the selecting selects a unit circuit having a highest priority degree from the plurality of unit circuits for the selected unit circuit.

20. The method of claim 19 wherein:
selecting selects a current unit circuit currently configured on the programmable logic circuit as the selected unit circuit when the current unit circuit has the highest priority degree; and
reconfiguring does not reconfigure the circuit arrangement of the programmable logic circuit.

21. A computer program product storing computer program instructions which when executed by a computer causes performance of a timeshare operating method of a programmable logic circuit that allocates process capabilities among a plurality of unit circuits, the programmable logic circuit including a dynamically reconfigurable circuit arrangement which is reconfigurable using circuit arrangement information of each unit circuit of the plurality of unit circuits, the method comprising:

provfding a plurality of memories, wherein a different pair of said memories is respectively provided for each of said plurality of unit circuits, storing in one memory of each of said pair of memories input data employed in a process operation of a corresponding unit circuit of the plurality of unit circuits, and storing in a second memory of each of said pair of memories output data generated by the process operation of said corresponding unit circuit of the plurality of unit circuits;

monitoring at least one of a storage amount of the input data, a storage amount of the output data and an amount of storage availability in the memory for the output data corresponding to each unit circuit of the plurality of unit circuits;

selecting a unit circuit from the plurality of unit circuits based on at least one of an amount of stored input data and an amount of stored output data; and reconfiguring the circuit arrangement of the programmable logic circuit using the circuit arrangement information of the selected unit circuit.

22. The computer program product according to claim 21, wherein monitoring monitors the storage amount of the input data corresponding to each unit circuit of the plurality of unit circuits; and selecting selects a unit circuit from the plurality of unit circuits for the selected unit circuit which satisfies both of the following conditions (A) and (B):
(A) the storage amount of the input data corresponding to the selected unit circuit exceeds a threshold, and
(B) the selected unit circuit is different from a current circuit currently configured on the programmable logic circuit.

23. The computer program product according to claim 21, wherein monitoring monitors the storage amount of the output data corresponding to each unit circuit of the plurality of unit circuits; and selecting selects a unit circuit from the plurality of unit circuits for the selected unit circuit which satisfies both of the following conditions (A) and (B):
(A) the storage amount of the output data corresponding to the selected unit circuit is smaller than a threshold, and
(B) the selected unit circuit is different from a current unit circuit currently configured on the programmable logic circuit.

24. The computer program product according to claim 21, wherein monitoring monitors both the storage amount of the input data and the storage amount of the output data of each unit circuit of the plurality of unit circuits; and selecting selects a unit circuit from the plurality of unit circuits for the selected unit circuit which is different from a current unit circuit currently configured on the programmable logic circuit, when one of the following conditions (A) and (B) is satisfied:
(A) the storage amount of the input data corresponding to the current unit circuit is smaller than a first threshold, and
(B) the storage amount of output data of the current unit circuit exceeds a second threshold.

25. The computer program product according to claim 21, wherein monitoring monitors both the storage amount of the input data and the amount of storage area availability in the memory for the output data; and selecting selects a unit circuit from the plurality of unit circuits for the selected unit circuit which is different from a current circuit currently configured on the programmable logic circuit, when one of the following conditions (A) and (B) is satisfied:
(A) the storage amount of the input data corresponding to the current unit circuit is smaller than a first threshold value, and
(B) the amount of storage area availability in the memory for the output data of the current unit circuit is smaller than a second threshold.

26. The computer program product according to claim 21, wherein the monitoring monitors both the storage amount of the input data and the storage amount of the output data of each unit circuit of the plurality of unit circuits, the method further comprising:

calculating priority degrees of each unit circuit of the plurality of unit circuits using the storage amount of the input data and the storage amount of the output data of each unit circuit of the plurality of the unit circuits, wherein the selecting selects a unit circuit having a highest priority degree from the plurality of unit circuits for the selected unit circuit.

27. The computer program product according to claim 26, wherein selecting selects the current unit circuit currently configured on the programmable logic circuit as the selected unit circuit when the current unit circuit has the highest priority degree; and reconfiguring does not reconfigure the circuit arrangement of the programmable logic circuit.

28. The apparatus of claim 1, comprising:
a memory switching unit connected to said programmable logic circuit and to each of said plurality of process data memories.

29. The method of claim 14, comprising:
selectively connecting said memories to said programmable logic circuit based upon a selection of said unit circuit.

30. The computer program product according to claim 21, wherein said method comprises:
selectively connecting said memories to said programmable logic circuit based upon a selection of said unit circuit.

* * * * *